(12) United States Patent
Tsujikawa et al.

(10) Patent No.: US 11,521,865 B2
(45) Date of Patent: Dec. 6, 2022

(54) SUBSTRATE PROCESSING METHOD AND SUBSTRATE PROCESSING DEVICE

(71) Applicant: SCREEN Holdings Co., Ltd., Kyoto (JP)

(72) Inventors: Hiroki Tsujikawa, Kyoto (JP); Masato Tanaka, Kyoto (JP); Tsuyoshi Okumura, Kyoto (JP); Atsuyasu Miura, Kyoto (JP); Makoto Takaoka, Kyoto (JP); Nobuyuki Miyaji, Kyoto (JP); Kazuhiro Fujita, Kyoto (JP); Naoki Sawazaki, Kyoto (JP); Takashi Akiyama, Kyoto (JP); Yuya Tsuchihashi, Kyoto (JP)

(73) Assignee: SCREEN Holdings Co., Ltd.

( * ) Notice: Subject to any disclaimer, the term of this patent is extended or adjusted under 35 U.S.C. 154(b) by 53 days.

(21) Appl. No.: 16/607,749

(22) PCT Filed: Apr. 17, 2018

(86) PCT No.: PCT/JP2018/015896
§ 371 (c)(1),
(2) Date: Oct. 24, 2019

(87) PCT Pub. No.: WO2018/198885
PCT Pub. Date: Nov. 1, 2018

(65) Prior Publication Data
US 2020/0144081 A1  May 7, 2020

(30) Foreign Application Priority Data

Apr. 28, 2017 (JP) ............................. JP2017-090264

(51) Int. Cl.
*H01L 21/67* (2006.01)
*B08B 3/08* (2006.01)

(52) U.S. Cl.
CPC .......... *H01L 21/67028* (2013.01); *B08B 3/08* (2013.01)

(58) Field of Classification Search
CPC ... B08B 3/08; H01L 21/67028; H01L 21/027; H01L 21/304; H01L 21/31133; H01L 21/67051; H01L 21/67253
See application file for complete search history.

(56) References Cited

U.S. PATENT DOCUMENTS 6,494,220 B1 * 12/2002 Matsuda ........... H01L 21/67051
134/182
9,136,104 B2 * 9/2015 Chuuman ......... H01L 21/02052
(Continued)

FOREIGN PATENT DOCUMENTS

JP   H11-045924 A    2/1999
JP   2012037770 A *  2/2012
(Continued)

OTHER PUBLICATIONS

JP2012-037770A machine translation (Year: 2012).*
(Continued)

*Primary Examiner* — Douglas Lee
(74) *Attorney, Agent, or Firm* — Ostrolenk Faber LLP

(57) ABSTRACT

A substrate processing method includes a liquid discharging step of discharging liquid through a nozzle toward a predetermined supply region on the main surface of a substrate held on a substrate holding unit within a chamber, a humidified gas supplying step of supplying humidified gas with a humidity higher than the humidity within the chamber onto the main surface of the substrate to remove electrical charges carried on the substrate, and a spin-drying step of rotating the substrate about a predetermined rotational axis after the liquid discharging step to spin off the liquid component from the main surface of the substrate. The humidified gas supplying step is started before the start of the liquid discharging step is started before the start of the liquid discharg-
(Continued)

ing step and ended at a predetermined termination timing after the start of the liquid discharging step and before the spin-drying step.

21 Claims, 12 Drawing Sheets

(56) References Cited

U.S. PATENT DOCUMENTS

| | | | | |
|---|---|---|---|---|
| 2003/0066549 | A1* | 4/2003 | Noda | H01L 21/67051 |
| | | | | 257/E21.255 |
| 2007/0104954 | A1 | 5/2007 | Ito et al. | 428/410 |
| 2008/0196835 | A1* | 8/2008 | Baldy | H01L 21/6708 |
| | | | | 156/345.23 |
| 2010/0012157 | A1* | 1/2010 | Sellmer | H01L 21/67051 |
| | | | | 134/29 |
| 2010/0018332 | A1* | 1/2010 | Moriya | G01M 99/002 |
| | | | | 73/865.8 |
| 2012/0067847 | A1* | 3/2012 | Sakurai | H01L 21/31111 |
| | | | | 156/345.15 |
| 2013/0167877 | A1 | 7/2013 | Fujiwara et al. | 134/26 |
| 2014/0231012 | A1* | 8/2014 | Hinode | H01L 21/6708 |
| | | | | 156/345.23 |
| 2015/0114432 | A1 | 4/2015 | Iwata et al. | |
| 2016/0035561 | A1 | 2/2016 | Aibara et al. | |
| 2018/0269056 | A1 | 9/2018 | Emoto et al. | |

FOREIGN PATENT DOCUMENTS

| | | |
|---|---|---|
| JP | 2013-138074 A | 7/2013 |
| JP | 2015-082650 A | 4/2015 |
| JP | 2017-069346 A | 4/2017 |
| TW | 200527483 A | 8/2005 |
| TW | 201603115 A | 1/2016 |
| TW | 201617144 A | 5/2016 |

OTHER PUBLICATIONS

International Search Report dated Jul. 10, 2018 in corresponding PCT International Application No. PCT/JP2018/015896.
Written Opinion dated Jul. 10, 2018 in corresponding PCT International Application No. PCT/JP2018/015896.
International Preliminary Report on Patentability (Chapter I) dated Nov. 7, 2019 with a Notification from the International Bureau (Form PCT/IB/326) in corresponding PCT International Application No. PCT/JP2018/015896 in Japanese.
English translation of the International Preliminary Report on Patentability (Chapter I) dated Nov. 7, 2019 with a Notification from the International Bureau (Form PCT/IB/338) in corresponding PCT International Application No. PCT/JP2018/015896.

* cited by examiner

SUBSTRATE PROCESSING METHOD AND SUBSTRATE PROCESSING DEVICE

CROSS-REFERENCE TO RELATED APPLICATIONS

The present application is a 35 U.S.C. § § 371 national phase conversion of PCT/JP2018/015896, filed Apr. 17, 2018, which claims priority to Japanese Patent Application No. 2017-090264, filed Apr. 28, 2017, the contents of both of which are incorporated herein by reference. The PCT International Application was published in the Japanese language.

TECHNICAL FIELD

The present invention relates to a substrate processing method and a substrate processing apparatus arranged to process the main surface of a substrate. Examples of substrates to be processed include semiconductor wafers, substrates for liquid crystal displays, substrates for plasma displays, substrates for FEDs (Field Emission Displays), substrates for optical disks, substrates for magnetic disks, substrates for magneto-optical disks, substrates for photomasks, ceramic substrates, and substrates for solar cells.

BACKGROUND ART

In semiconductor device manufacturing processes, substrate processing apparatuses of single substrate processing type, in which substrates are processed one by one, for example, include a chamber, a spin chuck for rotating a substrate while holding the substrate thereon approximately horizontally within the chamber, and a nozzle for discharging processing liquid therethrough toward the main surface of the substrate rotated by the spin chuck.

In substrate processing using such a substrate processing apparatus, chemical liquid processing, for example, is executed in which chemical liquid is supplied onto the main surface of the rotated substrate. The chemical liquid supplied on the main surface of the substrate receives a centrifugal force caused by the rotation of the substrate to flow toward the periphery on the main surface of the substrate and thereby cover all parts of the main surface of the substrate. This causes the entire main surface of the substrate to be processed by the chemical liquid.

A substrates carried into the chamber may have been charged in the previous process. If a substrate carried into the chamber, which is to be subject to chemical liquid processing, were charged, contact between the main surface of the substrate and chemical liquid when the chemical liquid is discharged through the nozzle onto the main surface of the substrate might cause electrostatic discharge at or near the site of landing of the chemical liquid. This might cause damage on the main surface of the substrate such as pattern destruction and/or boring into the device.

Hence, neutralizing liquid has conventionally been supplied onto the substrate before starting chemical liquid supply in order to prevent generation of electrostatic discharge on the main surface of the substrate at the start of chemical liquid supply, as described in Patent Literature 1 below.

CITATION LIST

Patent Literature

Patent Literature 1: Japanese Patent Application Publication No. 2015-082650

SUMMARY OF INVENTION

Technical Problem

However, the charge amount of substrates carried into the chamber may be large. In this case, some types of neutralizing liquid cannot sufficiently eliminate electrostatic charge of the substrate. In this case, when supplying the neutralizing liquid onto the substrate, contact between the main surface of the substrate and the neutralizing liquid may then cause electrostatic discharge.

Also, it may not be desirable to supply the neutralizing liquid onto the substrate depending on the type of the substrate and/or the chemical liquid. In this case, substrates carried into the chamber are to be first supplied with chemical liquid, which may cause the problem of electrostatic discharge to become evident.

To address this, the inventors of this application have considered employing an approach other than suppling neutralizing liquid to eliminate electrostatic charge of substrates carried into the chamber. That is, they have considered suppressing or preventing generation of electrostatic discharge due to supply of liquid (chemical liquid or neutralizing liquid) onto the substrate to thereby suppress or prevent the occurrence of damage on the main surface of the substrate.

It is an object of the present invention to provide a substrate processing method and a substrate processing apparatus that will be possible to suppress or prevent generation of electrostatic discharge due to supply of liquid onto a substrate to thereby suppress or prevent the occurrence of damage on the main surface of the substrate.

Solution to Problem

The present invention provides a substrate processing method arranged to process a substrate using processing liquid, the method including a liquid discharging step of discharging liquid through a nozzle toward a predetermined supply region on the main surface of a substrate held on a substrate holding unit within a chamber, a humidified gas supplying step of supplying humidified gas with a humidity higher than the humidity within the chamber onto the main surface of the substrate to remove electrical charges carried on the substrate, and a spin-drying step of rotating the substrate about a predetermined rotational axis after the liquid discharging step to spin off the liquid component from the main surface of the substrate, in which the humidified gas supplying step is started before the start of the liquid discharging step and ended at a predetermined termination timing after the start of the liquid discharging step and before the spin-drying step.

In this method, highly humidified gas is supplied toward a region including the supply region on the main surface of the substrate before the start of the liquid discharging step. If the substrate carried into the chamber is charged, by supplying highly humidified gas toward a region including the supply region, electrical charges at least on the supply region is diffused. The supply of the humidified gas is started prior to the start of the liquid discharging step and continued until the termination timing after the start of the liquid discharging step and before the spin-drying step. Accordingly, at the start of the liquid discharging step, when liquid discharged through the nozzle lands on the supply region, the electrical charges have been sufficiently removed from the supply region. That is, the liquid lands on the supply region from which the electrical charges have been sufficiently removed. This allows generation of electrostatic discharge due to discharge of liquid onto the substrate to be suppressed or prevented. It is therefore possible to suppress or prevent the occurrence of damage on the main surface of the substrate.

In one preferred embodiment of the present invention, the method further includes a processing liquid supplying step of supplying processing liquid onto the main surface of the substrate, in which the liquid discharging step includes a neutralizing liquid supplying step of discharging a neutralizing liquid through the nozzle toward a region including the supply region prior to the processing liquid supplying step.

In this method, the neutralizing liquid supplying step is executed before the processing liquid supplying step. Also, highly humidified gas is supplied toward a region including the supply region before the start of the neutralizing liquid supplying step. Since the neutralizing liquid is more electrically conductive than the processing liquid, supplying the neutralizing liquid onto the main surface of the substrate allows generation of electrostatic discharge due to discharge of liquid (neutralizing liquid) onto the substrate to be suppressed or prevented more effectively. It is therefore possible to suppress or prevent the occurrence of damage on the main surface of the substrate more effectively.

In one preferred embodiment of the present invention, the liquid discharging step includes a processing liquid supplying step of supplying processing liquid through the nozzle toward a region including the supply region.

In this method, highly humidified gas is supplied toward a region including the supply region before the start of the processing liquid supplying step. This allows generation of electrostatic discharge due to discharge of liquid (processing liquid) onto the substrate to be suppressed or prevented. It is therefore possible to suppress or prevent the occurrence of damage on the main surface of the substrate.

In one preferred embodiment of the present invention, the termination timing is a predetermined timing before the end of the liquid discharging step or timing at the end of the liquid discharging step.

In this method, the humidified gas supplying step is ended before or at the end of the liquid discharging step. Accordingly, the humidified gas is not supplied in the spin-drying step. It is therefore possible to execute the spin-drying step while maintaining a low-humidity atmosphere around the main surface of the substrate. This allows the main surface of the substrate to be satisfactorily dried in the spin-drying step.

In one preferred embodiment of the present invention, the method further includes, in parallel with the spin-drying step, a dehumidified gas supplying step of supplying dehumidified gas with a humidity lower than the humidity of the humidified gas onto the main surface of the substrate.

In this method, dehumidified gas with low humidity is supplied onto the main surface of the substrate in parallel with the spin-drying step. Accordingly, humidified gas, even if remaining around the main surface of the substrate at the start of the spin-drying step, can be replaced with dehumidified gas. It is therefore possible to execute the spin-drying step while maintaining a low-humidity atmosphere around the main surface of the substrate. This allows the main surface of the substrate to be satisfactorily dried in the spin-drying step.

In one preferred embodiment of the present invention, the humidified gas supplying step includes a first humidified gas supplying step of blowing the humidified gas through a first nozzle onto a region including the supply region on the main surface of the substrate.

In this method, the humidified gas is blown onto a region including the supply region. Therefore, electrostatic charge of the supply region can reliably eliminated.

In one preferred embodiment of the present invention, the humidified gas supplying step includes a second humidified gas supplying step of forming, in a vicinity of the main surface of the substrate, a gas flow of the humidified gas flowing along the main surface of the substrate.

In this method, a gas flow of the humidified gas flowing along the main surface of the substrate is formed. Therefore, electrostatic charge of main surface of the substrate can eliminated over a wide range. This allows satisfactorily eliminating electrostatic charge from the supply region.

In one preferred embodiment of the present invention, the humidified gas supplying step includes a third humidified gas supplying step of supplying the humidified gas from outside the chamber into the chamber.

In this method, by supplying humidified gas into the chamber, the atmosphere within the chamber is replaced with the humidified gas. Therefore, it is possible to supply to the supply region with the humidified gas.

In one preferred embodiment of the present invention, the humidified gas supplying step includes a fourth humidified gas supplying step of supplying the humidified gas into a space between an opposing surface facing the main surface of the substrate and the main surface of the substrate.

In this method, supplying humidified gas between the opposing surface, therefore, the main surface of the substrate allows the supply region to be supplied with the humidified gas.

The present invention provides a substrate processing apparatus arranged to process a substrate using processing liquid, the apparatus including a chamber, a substrate holding unit accommodated within the chamber to hold a substrate, a rotating unit for rotating the substrate held on the substrate holding unit about a predetermined rotational axis, a liquid supplying unit having a nozzle for discharging liquid therethrough toward the main surface of the substrate held on the substrate holding unit to supply the liquid onto the main surface of the substrate, a humidified gas supplying unit for supplying humidified gas with a humidity higher than the humidity within the chamber onto the main surface of the substrate held on the substrate holding unit, and a controller for controlling the liquid supplying unit and the humidified gas supplying unit, in which the controller is arranged to execute a liquid discharging step of discharging liquid through the nozzle toward a predetermined supply region on the main surface of the substrate, a humidified gas supplying step of supplying, by the humidified gas supplying unit, humidified gas with a humidity higher than the humidity within the chamber onto the main surface of the substrate to remove electrical charges carried on the substrate, and a spin-drying step of rotating the substrate about the rotational axis after the liquid discharging step to spin off the liquid component from the main surface of the substrate and is arranged to end the humidified gas supplying step at a predetermined termination timing after the start of the liquid discharging step and before the spin-drying step.

With this arrangement, highly humidified gas is supplied toward a region including the supply region on the main surface of the substrate before the start of the liquid discharging step. If the substrate carried into the chamber is charged, by supplying highly humidified gas toward a region including the supply region, electrical charges at least on the supply region is diffused. The supply of the humidified gas is started prior to the start of the liquid discharging step and continued until the termination timing after the start of the liquid discharging step and before the spin-drying step. Accordingly, in the liquid discharging step, when liquid discharged through the nozzle lands on the supply region, the electrical charges have been sufficiently removed from the supply region. That is, the liquid lands on the supply region from which the electrical charges have been sufficiently removed. This allows generation of electrostatic discharge due to discharge of liquid onto the substrate to be suppressed or prevented. It is therefore possible to suppress or prevent the occurrence of damage on the main surface of the substrate.

In one preferred embodiment of the present invention, the apparatus further includes a processing liquid supplying unit for supplying processing liquid onto the main surface of the substrate held on the substrate holding unit. Further, the liquid supplying unit includes a neutralizing liquid supplying unit for supplying a conductive neutralizing liquid with a specific resistance lower than the specific resistance of the processing liquid onto the main surface of the substrate. In this case, the controller is arranged to further control the processing liquid supplying unit, and the controller is arranged to execute a processing liquid supplying step of supplying, by the processing liquid supplying unit, processing liquid onto the main surface of the substrate and is arranged to execute, in the liquid discharging step, a neutralizing liquid supplying step of discharging the neutralizing liquid through the nozzle toward a region including the supply region prior to the processing liquid supplying step.

With this arrangement, the neutralizing liquid supplying step is executed before the processing liquid supplying step. Also, highly humidified gas is supplied toward a region including the supply region before the start of the neutralizing liquid supplying step. Since the neutralizing liquid is more electrically conductive than the processing liquid, supplying the neutralizing liquid onto the main surface of the substrate allows generation of electrostatic discharge due to discharge of liquid (neutralizing liquid) onto the substrate to be suppressed or prevented more effectively. It is therefore possible to suppress or prevent the occurrence of damage on the main surface of the substrate more effectively.

In one preferred embodiment of the present invention, the liquid supplying unit includes a processing liquid supplying unit for supplying processing liquid onto the main surface of the substrate held on the substrate holding unit. In this case, the controller may execute, in the liquid discharging step, a processing liquid supplying step of supplying processing liquid through the nozzle toward a region including the supply region.

With this arrangement, highly humidified gas is supplied toward a region including the supply region before the start of the processing liquid supplying step. This allows generation of electrostatic discharge due to discharge of liquid (processing liquid) onto the substrate to be suppressed or prevented. It is therefore possible to suppress or prevent the occurrence of damage on the main surface of the substrate.

In one preferred embodiment of the present invention, the termination timing is a predetermined timing before the end of the liquid discharging step or timing at the end of the liquid discharging step.

With this arrangement, the humidified gas supplying step is ended before or at the end of the liquid discharging step. Accordingly, the humidified gas is not supplied in the spin-drying step. It is therefore possible to execute the spin-drying step while maintaining a low-humidity atmosphere around the main surface of the substrate. This allows the main surface of the substrate to be satisfactorily dried in the spin-drying step.

In one preferred embodiment of the present invention, the controller is arranged to further execute, in parallel with the spin-drying step, a dehumidified gas supplying step of supplying dehumidified gas with a humidity lower than the humidity of the humidified gas onto the main surface of the substrate.

With this arrangement, dehumidified gas with low humidity is supplied onto the main surface of the substrate in parallel with the spin-drying step. Accordingly, humidified gas, even if remaining around the main surface of the substrate at the start of the spin-drying step, can be replaced with dehumidified gas. It is therefore possible to execute the spin-drying step while maintaining a low-humidity atmosphere around the main surface of the substrate. This allows the main surface of the substrate to be satisfactorily dried in the spin-drying step.

In one preferred embodiment of the present invention, the humidified gas supplying unit has a first nozzle for blowing the humidified gas therethrough onto the main surface of the substrate. In this case, the controller may execute, in the humidified gas supplying step, a first humidified gas supplying step of blowing the humidified gas through the first nozzle onto a region including the supply region on the main surface of the substrate.

With this arrangement, the humidified gas is blown onto a region including the supply region. Therefore, electrostatic charge of the supply region can reliably eliminated.

In one preferred embodiment of the present invention, the humidified gas supplying unit has a second nozzle for forming a gas flow of the humidified gas flowing along the main surface of the substrate. In this case, the controller may execute, in the humidified gas supplying step, a second humidified gas supplying step of forming, in a vicinity of the main surface of the substrate, by the second nozzle, a gas flow of the humidified gas flowing along the main surface of the substrate.

With this arrangement, a gas flow of the humidified gas flowing along the main surface of the substrate is formed. Therefore, electrostatic charge of main surface of the substrate can eliminated over a wide range. This allows satisfactorily eliminating electrostatic charge from the supply region.

In one preferred embodiment of the present invention, the humidified gas supplying unit includes a unit for supplying the humidified gas into the chamber. In this case, the controller may execute, in the humidified gas supplying step, a third humidified gas supplying step of supplying the humidified gas from outside the chamber into the chamber.

With this arrangement, by supplying humidified gas into the chamber, the atmosphere within the chamber is replace with the humidified gas. Therefore, it is possible to supply to the supply region with the humidified gas.

In one preferred embodiment of the present invention, the apparatus further includes an opposing member having an opposing surface facing the main surface of the substrate. In this case, the controller may execute, in the humidified gas supplying step, a fourth humidified gas supplying step of supplying the humidified gas into a space between the opposing surface and the main surface of the substrate.

With this arrangement, supplying humidified gas between the opposing surface, therefore, the main surface of the substrate allows the supply region to be supplied with the humidified gas.

The aforementioned or other objects, features, and advantageous effects of the present invention will be clarified by the following description of preferred embodiments given below with reference to the accompanying drawings.

DESCRIPTION OF EMBODIMENTS

Figure 1:
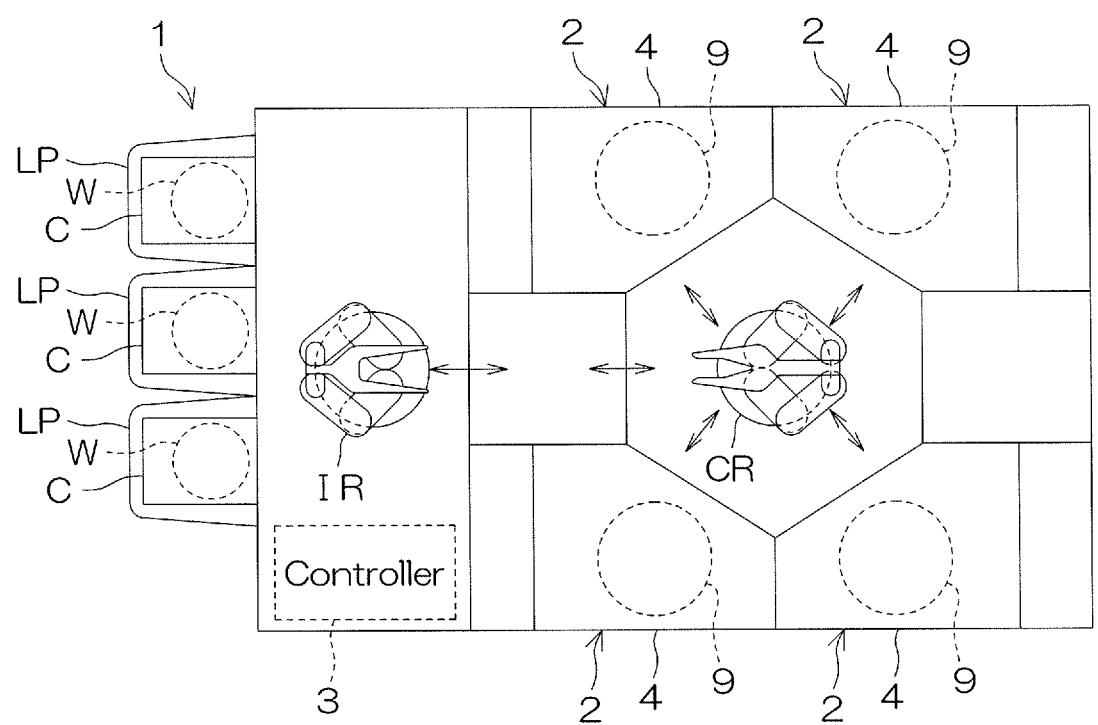
FIG. 1 is an illustrative plan view for describing the internal layout of a substrate processing apparatus according to a first preferred embodiment of the present invention.

FIG. 1 is an illustrative plan view for describing the internal layout of a substrate processing apparatus 1 according to a first preferred embodiment of the present invention. The substrate processing apparatus 1 is a single substrate processing type apparatus, in which substrates W such as silicon wafers are processed one by one. In this preferred embodiment, such a substrate W is a disk-shaped substrate. The substrate processing apparatus 1 includes a plurality of processing units 2 that process substrates W with processing liquid, loading ports LP with a carrier C placed thereon arranged to accommodate a plurality of substrates W to be processed in the processing units 2, transfer robots IR and CR which transfers substrates W between each loading port LP and each processing unit 2, and a controller 3 which controls the substrate processing apparatus 1. The transfer robot IR is arranged to transfer substrates W between each carrier C and the transfer robot CR. The transfer robot CR is arranged to transfer substrates W between the transfer robot IR and each processing unit 2. The plurality of processing units 2 have the same configuration, for example.

Figure 2:
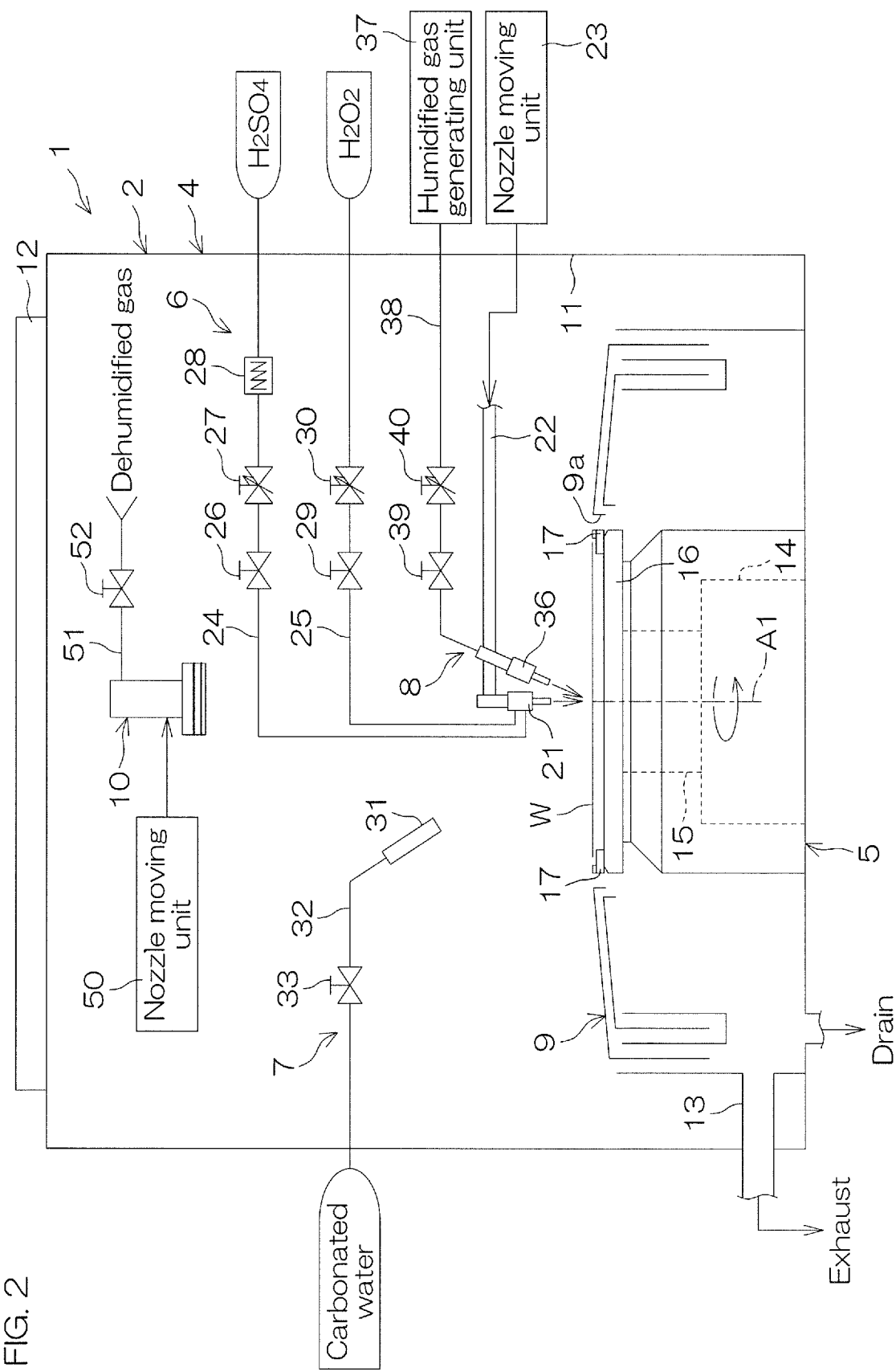
FIG. 2 is an illustrative cross-sectional view for describing an example configuration of a processing unit included in the substrate processing apparatus.

FIG. 2 is an illustrative vertical cross-sectional view for describing an example configuration of each of the processing units 2.

The processing unit 2 includes a box-shaped chamber 4, a spin chuck (substrate holding unit) 5 which holds a substrate W in a horizontal posture within the chamber 4 and rotates the substrate W about a vertical rotational axis A1 that runs through the center of the substrate W, a chemical liquid supplying unit (processing liquid supplying unit) 6 which supplies chemical liquid (processing liquid) onto the upper surface (main surface) of the substrate W held on the spin chuck 5, a carbonated water supplying unit (neutralizing liquid supplying unit) 7 which supplies carbonated water as neutralizing liquid and rinse liquid onto the upper surface of the substrate W held on the spin chuck 5, a humidified gas supplying unit 8 which supplies humidified gas with high humidity (e.g. a relative humidity of 65 to 90%) onto the upper surface of the substrate W held on the spin chuck 5, and a cylindrical cup 9 surrounding the spin chuck 5.

The chamber 4 includes a box-shaped partition wall 11 accommodating the spin chuck 5 and a nozzle, an FFU (fan filter unit) 12 serving as a blower unit which sends clean air (filtered air) through an upper portion of the partition wall 11 into the partition wall 11, and an exhaust duct 13 which exhausts gas within the chamber 4 through a lower portion of the partition wall 11. The FFU 12 is disposed on the upper side of the partition wall 11 and mounted on the ceiling of the partition wall 11. The FFU 12 sends clean air downward through the ceiling of the partition wall 11 into the chamber 4. The exhaust duct 13 is connected to a bottom portion of the cup 9 and arranged to guide gas within the chamber 4 out toward exhaust treatment equipment provided in the plant in which the substrate processing apparatus 1 is installed. Accordingly, a downflow (downward-flowing stream) that flows downward within the chamber 4 is formed by the FFU 12 and the exhaust duct 13. The substrate W is to be processed with such a downflow being formed within the chamber 4.

The spin chuck 5 employs a clamping-type chuck which clamps the substrate W in horizontal directions and holds the substrate W horizontally. Specifically, the spin chuck 5 includes a spin motor (rotating unit) 14, a spin shaft 15 integrated with a drive shaft of the spin motor 14, and a disk-shaped spin base 16 mounted approximately horizontally at the upper end of the spin shaft 15.

A plurality of (three or more; e.g. six) clamping members 17 are disposed in a peripheral edge portion on the upper surface of the spin base 16. The plurality of clamping members 17 are disposed in the peripheral edge portion on the upper surface of the spin base 16 with appropriate spacing therebetween on a circumference corresponding to the outer peripheral shape of the substrate W.

The spin chuck 5 is not limited to a clamping type chuck. For example, a vacuum-suction type one (vacuum chuck) disposed to vacuum-suck the rear surface of the substrate W to hold the substrate W in a horizontal posture and, in this state, rotate it about the vertical rotational axis to thereby rotate the substrate W held on the spin chuck 5.

As shown in FIG. 2, the chemical liquid supplying unit 6 includes a chemical liquid nozzle 21, a nozzle arm 22 with the chemical liquid nozzle 21 mounted in a leading end portion thereof, and a first nozzle moving unit 23 which moves the nozzle arm 22 to move the chemical liquid nozzle 21.

The chemical liquid nozzle 21 is a straight nozzle arranged to discharge chemical liquid in a continuous-flow stream. In this preferred embodiment, the chemical liquid discharged through the chemical liquid nozzle 21 employs SPM (sulfuric acid/hydrogen peroxide mixture; a mixture containing $H_2SO_4$ (sulfuric acid) and $H_2O_2$ (hydrogen peroxide)).

The chemical liquid nozzle 21 is mounted to the nozzle arm 22 in, for example, a vertical posture in which processing liquid is discharged vertically onto the upper surface of the substrate W. The chemical liquid nozzle 21 may be held on the nozzle arm 22 in an inward-directed posture in which chemical liquid is discharged in a discharge direction inclined with respect to the upper surface of the substrate W such that the chemical liquid lands at a position inward of the discharge port (nearer the rotational axis A1) or may be held on the nozzle arm 22 in an outward-directed posture in which chemical liquid is discharged in a discharge direction inclined with respect to the upper surface of the substrate W such that the chemical liquid lands at a position outward of the discharge port (farther from the rotational axis A1).

The nozzle arm 22 extends horizontally to be provided swingably about a revolving axis (not shown) extending vertically around the spin chuck 5. The first nozzle moving unit 23 is arranged to rotate the nozzle arm 22 about the revolving axis to move the chemical liquid nozzle 21 horizontally along a locus that passes through a central portion on the upper surface of the substrate W in plan view. The first nozzle moving unit 23 is arranged to move the chemical liquid nozzle 21 horizontally between a processing position at which SPM discharged through the chemical liquid nozzle 21 lands on the upper surface of the substrate W and a home position at which the chemical liquid nozzle 21 is set around the spin chuck 5 in plan view. In this preferred embodiment, the processing position is, for example, a central position at which SPM discharged through the chemical liquid nozzle 21 lands within the central portion on the upper surface of the substrate W.

The chemical liquid supplying unit 6 is connected to the chemical liquid nozzle 21 and further includes a sulfuric acid line 24 through which $H_2SO_4$ is supplied from a sulfuric acid supply source and a hydrogen peroxide line 25 through which $H_2O_2$ is supplied from a hydrogen peroxide supply source.

In the middle of the sulfuric acid line 24, a sulfuric acid valve 26 for opening and closing the sulfuric acid line 24, a sulfuric acid flow regulating valve 27, and a heater 28 are disposed in this order from the chemical liquid nozzle 21 side. The heater 28 is arranged to keep $H_2SO_4$ at a temperature (a constant temperature within a range of 80 to 180 degrees C.; e.g. 90 degrees C.) higher than the room temperature. The heater 28 arranged to heat $H_2SO_4$ may be such a one-path-type heater as shown in FIG. 2 or may be a circulation-type heater in which $H_2SO_4$ is circulated and heated within a circulation path including the heater. The sulfuric acid flow regulating valve 27 includes a valve body with a valve seat provided therein, a valve element for opening and closing the valve seat, and an actuator for moving the valve element between an open position and a closed position, though not shown. The same applies to other flow regulating valves.

In the middle of the hydrogen peroxide line 25, a hydrogen peroxide valve 29 for opening and closing the hydrogen peroxide line 25 and a hydrogen peroxide flow regulating valve 30 are disposed in this order from the chemical liquid nozzle side. $H_2O_2$ which is not temperature-adjusted and is approximately of ordinary temperature (about 23 degrees C.) is arranged to be supplied through the hydrogen peroxide line 25 to the chemical liquid nozzle 21.

The chemical liquid nozzle 21 has, for example, an approximately circular cylindrical casing (not shown). The sulfuric acid line 24 is connected to a sulfuric acid introduction port disposed in the side wall of the casing of the chemical liquid nozzle 21.

When the sulfuric acid valve 26 and the hydrogen peroxide valve 29 are opened, $H_2SO_4$ from the sulfuric acid line 24 and $H_2O_2$ from the hydrogen peroxide line 25 are supplied into the casing (not shown) of the chemical liquid nozzle 21 and mixed (stirred) sufficiently within the casing. Thus mixing causes $H_2SO_4$ and $H_2O_2$ to be mixed homogeneously and react with each other, so that a mixture of $H_2SO_4$ and $H_2O_2$ (SPM) is generated. SPM contains peroxymonosulfuric acid ($H_2SO_5$), which is highly oxidative, and arranged to have an increased temperature higher than the temperature of $H_2SO_4$ and $H_2O_2$ before mixing (equal to or higher than 150 degrees C.; e.g. about 157 degrees C.). The generated high-temperature SPM is discharged through a discharge port opened at the leading end (e.g. lower end) of the casing of the chemical liquid nozzle 21.

The carbonated water supplying unit 7 includes a carbonated water nozzle 31 which discharges carbonated water onto the substrate W held on the spin chuck 5, a carbonated water line 32 which supplies carbonated water therethrough to the carbonated water nozzle 31, and a carbonated water valve 33 which switches between supplying and stopping the supplying of carbonated water through the carbonated water line 32 to the carbonated water nozzle 31. The carbonated water nozzle 31 is, for example, a straight nozzle which to discharges liquid in a continuous-flow stream. The carbonated water nozzle 31 is a fixed nozzle that discharges carbonated water with the discharge port of the carbonated water nozzle 31 being kept at rest. The carbonated water supplying unit 7 may include a carbonated water nozzle moving device which moves the carbonated water nozzle 31 to move the position (supply region) at which carbonated water lands on the upper surface of the substrate W.

When the carbonated water valve 33 is opened, rinse liquid supplied through the carbonated water line 32 to the carbonated water nozzle 31 is discharged through the carbonated water nozzle 31 toward the central portion on the upper surface of the substrate W. In this preferred embodiment, the carbonated water serves as both neutralizing liquid and rinse liquid. That is, the carbonated water supplying unit 7 serves not only as a neutralizing liquid supplying unit but also as a carbonated water supplying unit (processing liquid supplying unit).

The humidified gas supplying unit 8 includes a humidified gas nozzle (first nozzle) 36 which blows humidified gas onto the upper surface of the substrate W held on the spin chuck 5, a humidified gas generating unit 37 which generates humidified gas, and a humidified gas line 38 for supplying humidified gas from the humidified gas generating unit 37 therethrough to the humidified gas nozzle 36. In the middle of the humidified gas line 38, a humidified gas valve 39 for opening and closing the humidified gas line 38 and a humidified gas flow regulating valve 40 are disposed in this order from the humidified gas nozzle 36 side.

In this preferred embodiment, the humidified gas nozzle 36 is mounted to the nozzle arm 22 nearer the base end than the chemical liquid nozzle 21. That is, the chemical liquid nozzle 21 and the humidified gas nozzle 36 are mounted to the nozzle arm 22 in this order from the leading end side. In this preferred embodiment, the humidified gas nozzle 36 is held on the nozzle arm 22 in an inward-directed posture in which humidified gas is discharged in a discharge direction inclined with respect to the upper surface of the substrate W such that the humidified gas is blown at a position inward of the discharge port (nearer the rotational axis A1). Since the discharge direction is thus inclined, in this preferred embodiment, the humidified gas through the humidified gas nozzle 36 onto the upper surface of the substrate W is blown in a region including the supply region DB (see FIG. 7) of chemical liquid through the chemical liquid nozzle 21 on the upper surface of the substrate W. This causes the humidified gas blown onto the upper surface of the substrate W to cover the supply region DB. The nozzle may be held on the nozzle arm 22 in a vertical posture in which processing liquid is discharged in a direction perpendicular to the upper surface of the substrate W or may be held on the nozzle arm 22 in an outward-directed posture in which humidified gas is discharged in a discharge direction inclined with respect to the upper surface of the substrate W such that the humidified gas is blown at a position outward of the discharge port (farther from the rotational axis A1). Further, the humidified gas nozzle 36 may be mounted to the nozzle arm 22 nearer the leading end than the chemical liquid nozzle 21.

Figure 3:
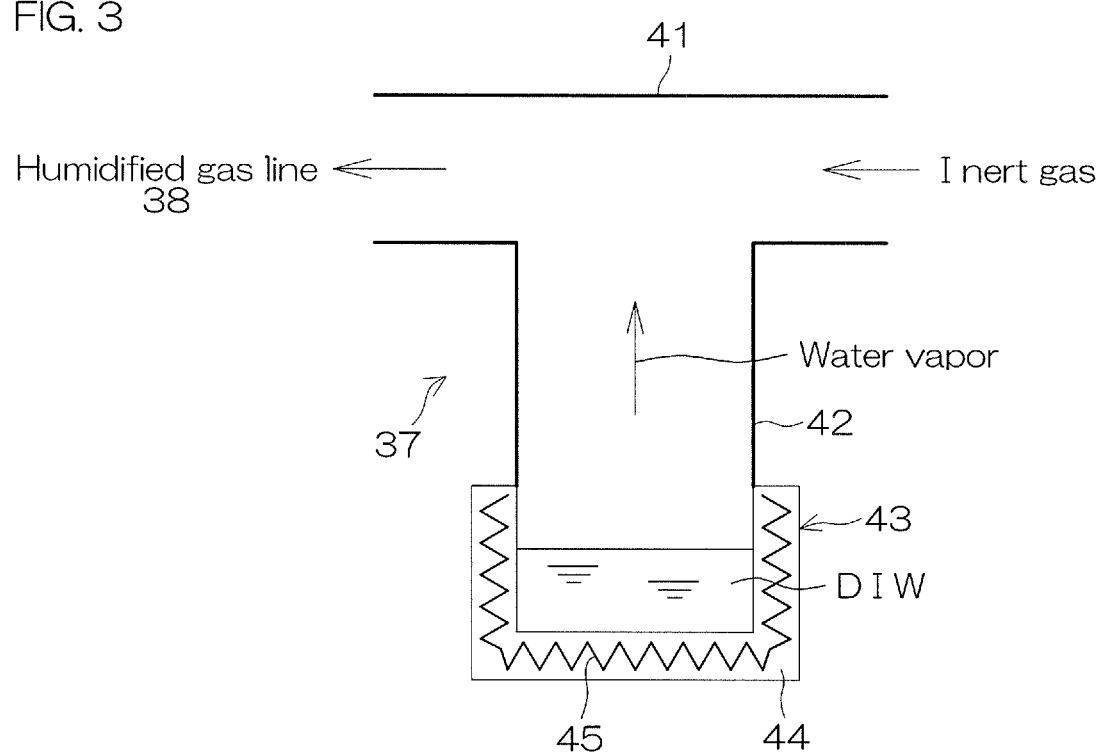
FIG. 3 is a view for describing a configuration of a humidified gas generating unit.

FIG. 3 is a view for describing a configuration of the humidified gas generating unit 37.

The humidified gas generating unit 37 is arranged to add water vapor to inert gas to generate highly humidified gas. The humidified gas generating unit 37 includes a supply line 41 with one end thereof connected to the humidified gas line 38. The supply line 41 is arranged to be introduced with inert gas at the other end. In the middle of the supply line 41, one end of a vapor line 42 is connected to supply water vapor to the supply line 41. A vapor generating unit 43 is disposed at the other end of the vapor line 42. The vapor generating unit 43 includes a storage tank 44 arranged to store water (e.g. DIW (deionized water)) and a heater 45 is incorporated in the storage tank 44. When the heater 45 is turned on with the storage tank 44 storing water therein, the storage tank 44 is heated and water stored in the storage tank 44 is vaporized. That is, water vapor is generated in the vapor generating unit 43. The generated water vapor is supplied through the vapor line 42 to the supply line 41. The water vapor is then mixed with inert gas within the supply line 41, whereby highly humidified gas is generated.

As shown in FIG. 2, the substrate processing apparatus 1 further includes an upper nozzle (first nozzle, second nozzle) 10 arranged to supply dehumidified gas with low humidity (lower than the humidity of the humidified gas) onto the upper surface of the substrate W held on the spin chuck 5. The upper nozzle 10 is coupled with a second nozzle moving unit 50 arranged to move the upper nozzle 10 up-and-down and horizontally. The second nozzle moving unit 50 is arranged to move the upper nozzle 10 horizontally along an arc-shaped locus that passes through the central portion on the upper surface of the substrate W held on the spin chuck 5. The second nozzle moving unit 50 is arranged to move the upper nozzle 10 between a processing position over the central portion on the upper surface of the substrate W and a home position for sideward retraction from over the substrate W.

The upper nozzle 10 is coupled with a gas line 51. Dehumidified gas is supplied through the gas line 51 to the upper nozzle 10. A gas valve 52 arranged to open and close the flow path of the gas line is disposed in the gas line 51. The dehumidified gas supplied through the gas line 51 employs inert gas with low humidity as dehumidified gas with low humidity. The inert gas includes nitrogen gas or dry air. The relative humidity of the dehumidified gas is, for example, 0.005 to 0.02% RH (with a dew point of −78 to −70 degrees C.).

Figure 4:
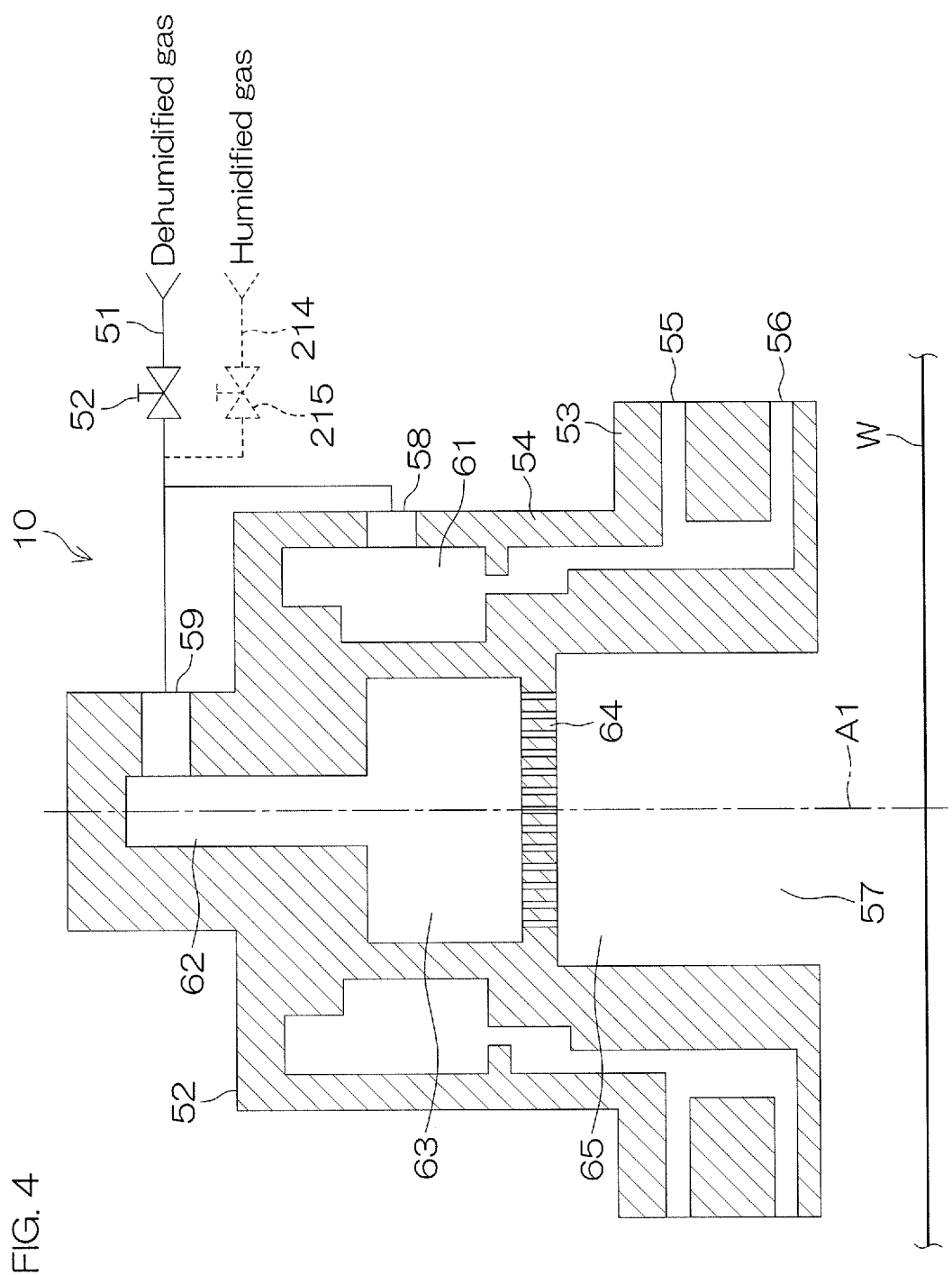
FIG. 4 is a schematic vertical cross-sectional view for describing an example configuration of an upper nozzle.

FIG. 4 is a schematic vertical cross-sectional view for describing an example configuration of the upper nozzle 10 shown in FIG. 2. FIG. 4 shows a state where the upper nozzle 10 is disposed at the processing position. The upper nozzle 10 has a circular cylindrical nozzle body 54 having a flange portion 53 at its lower end. In the outer peripheral surface, which is the side surface of the flange portion 53, an upper gas discharge port 55 and a lower gas discharge port 56 are respectively opened annularly outward. The upper gas discharge port 55 and the lower gas discharge port 56 are disposed in a vertically spaced manner. A central gas discharge port 57 is disposed in the lower surface of the nozzle body 54.

The nozzle body 54 is formed with gas introduction ports 58, 59 through which dehumidified gas is supplied from the gas line 51. An individual dehumidified gas line may be coupled to each of the gas introduction ports 58, 59. Within the nozzle body 54 is formed a cylindrical gas flow path 61 that connects the gas introduction port 58 with the upper gas discharge port 55 and the lower gas discharge port 56. Within the nozzle body 54 is also formed a cylindrical gas flow path 62 in communication with the gas introduction port 59. The gas flow path 62 communicates downward with a buffer space 63. The buffer space 63 further communicates downward with a space via a punching plate 64. The space 65 is open to the central gas discharge port 57.

Dehumidified gas introduced through the gas introduction port 58 is supplied through the gas flow path 61 to the upper gas discharge port 55 and the lower gas discharge port 56 and discharged radially through the gas discharge ports 55, 56. This causes two vertically overlapping radial gas flows to be formed over the substrate W. On the other hand, dehumidified gas introduced through the gas introduction port 59 is stored in the buffer space 3 through the gas flow path 62 and further diffused through the punching plate 64, and then discharged through the space 65 from the central gas discharge port 57 downward onto the upper surface of the substrate W. The dehumidified gas hits the upper surface of the substrate W to be redirected to form a radial flow of dehumidified gas over the substrate W.

Accordingly, the radial gas flow of dehumidified gas discharged through the central gas discharge port 57 and the two-layered radial gas flows discharged through the gas discharge ports 55, 56 added together cause three-layered radial gas flows to be formed over the substrate W. The three-layered radial gas flows cover the upper surface of the substrate W.

As shown in FIG. 2, the cup 9 is disposed outward of the substrate W held on the spin chuck 5 (away from the rotational axis A1). The cup 9 surrounds the spin base 16. When processing liquid is supplied onto the substrate W with the spin chuck 5 rotating the substrate W, the processing liquid supplied on the substrate W is spun off around the substrate W. When the processing liquid is supplied onto the substrate W, an upper end portion 9a of the cup 9 opened upward is disposed at a position higher than the spin base 16. Accordingly, the processing liquid (chemical liquid, rinse liquid, etc.) discharged around the substrate W is received by the cup 9. The processing liquid received by the cup 9 is then sent to a recovery device or a draining device not shown.

Figure 5:
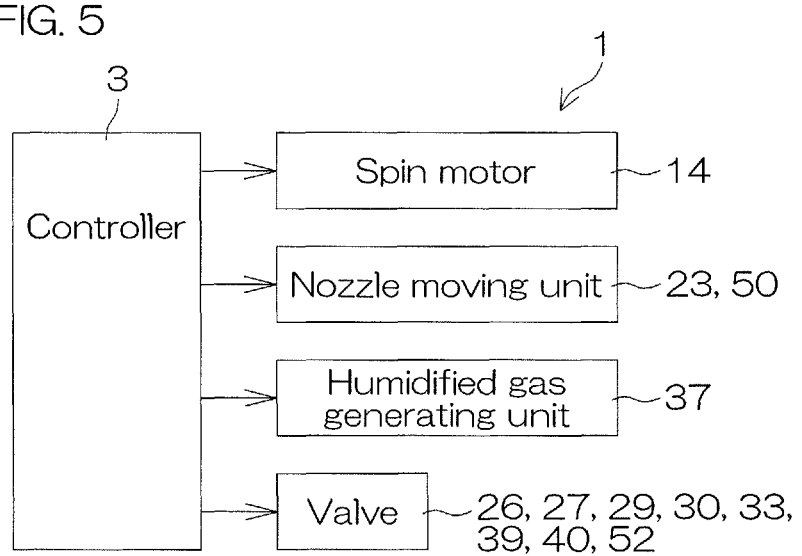
FIG. 5 is a block diagram for describing an electrical configuration of a major part of the substrate processing apparatus.

FIG. 5 is a block diagram for describing an electrical configuration of a major part of the substrate processing apparatus 1.

The controller 3 is constructed using a microcomputer, for example. The controller 3 has an arithmetic unit such as a CPU, a storage unit such as a static memory device and/or a hard disk drive, and an input/output unit. The storage unit stores therein a program to be executed by the arithmetic unit.

The controller 3 is also connected with, for example, the spin motor 14, the first and second nozzle moving unit 23, 50, and the humidified gas generating unit 37 to be controlled. The controller 3 is arranged to control the operation of, for example, the spin motor 14, the first and second nozzle moving unit 23, 50, and the humidified gas generating unit 37 according to a predefined program. The controller 3 is also arranged to open and close, for example, the sulfuric acid valve 26, the hydrogen peroxide valve 29, the carbonated water valve 33, the humidified gas valve 39, and the gas valve 52 according to a predefined program. The controller 3 is also arranged to adjust the opening degree of, for example, the sulfuric acid flow regulating valve 27, the hydrogen peroxide flow regulating valve 30, and the humidified gas flow regulating valve 40 according to a predefined program.

Figure 6:
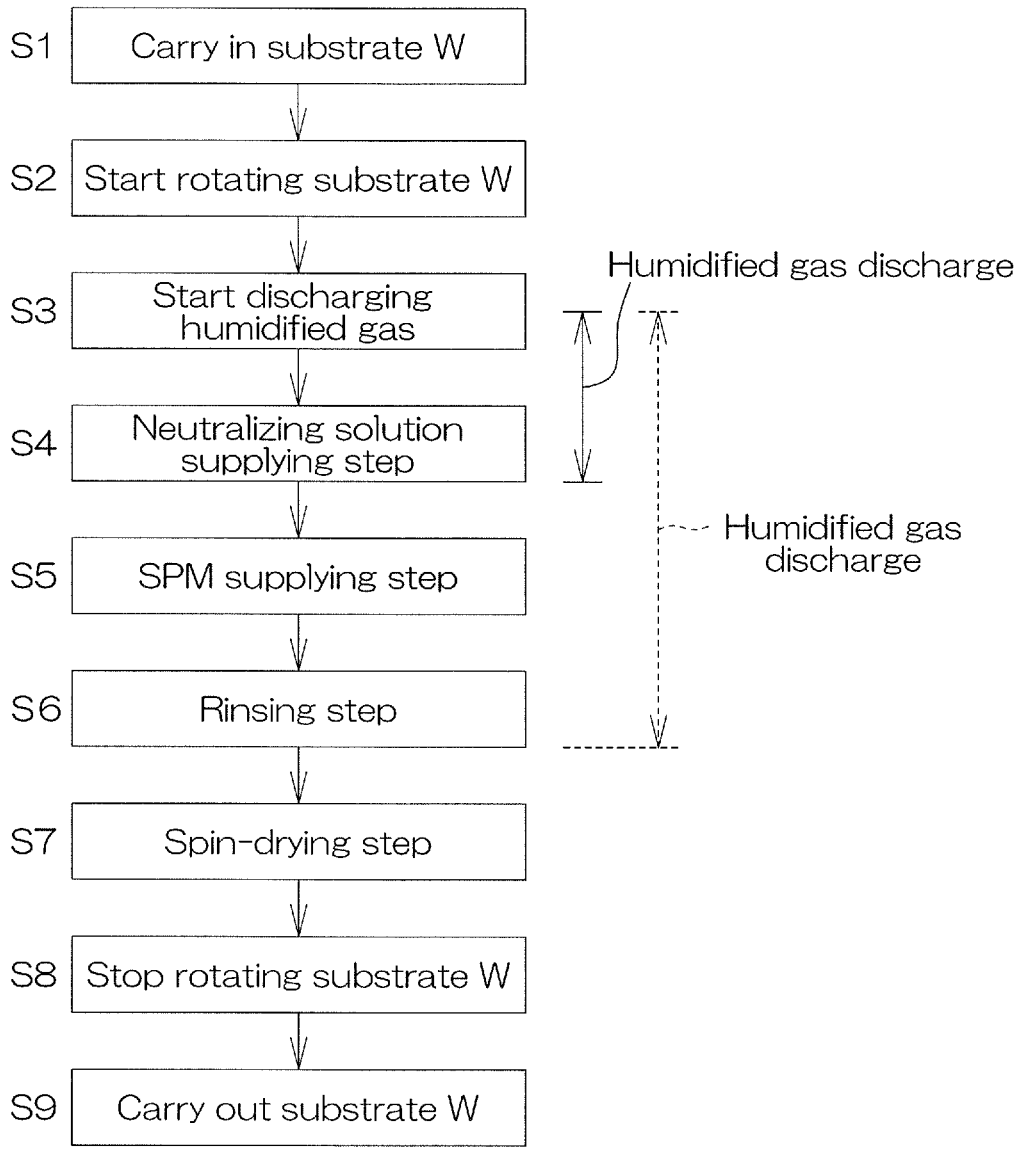
FIG. 6 is a flow chart for describing a first substrate processing example by the processing unit.
Figure 7:
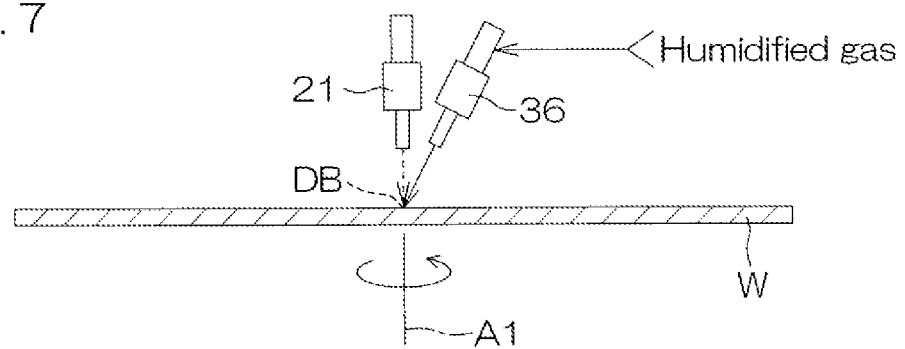
FIG. 7 is a schematic horizontal view of the substrate under a humidified gas supplying step.
Figure 8:
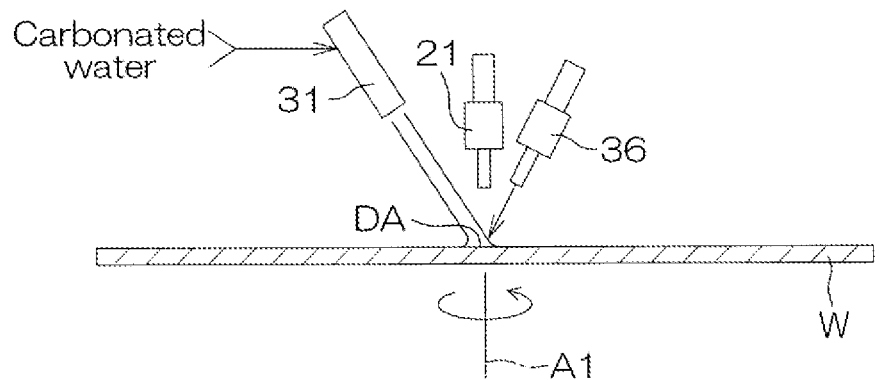
FIG. 8 is a schematic horizontal view of the substrate under a neutralizing liquid supplying step.
Figure 9:
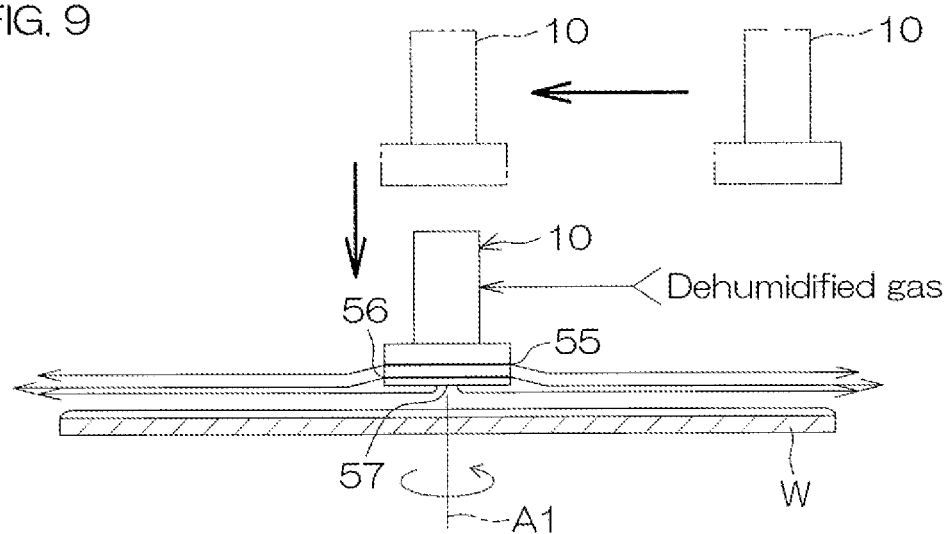
FIG. 9 is a schematic horizontal view of the substrate under a spin-drying step.

FIG. 6 is a flow chart for describing a first substrate processing example by the processing unit 2. FIG. 7 is a schematic horizontal view of the substrate W under a humidified gas supplying step (S3). FIG. 8 is a schematic horizontal view of the substrate W under a neutralizing liquid supplying step (S4). FIG. 9 is a schematic horizontal view of the substrate W under a spin-drying step (S7).

The first substrate processing example will be described with reference to FIGS. 1 to 6. Reference to FIGS. 7 to 9 will be made appropriately.

The first substrate processing example is resist removing processing for removing resist from the upper surface (main surface) of the substrate W. When the first substrate processing example is executed on the substrate W by the processing unit 2, the substrate W after ion implantation processing at high dose is carried into the chamber 4 (step S1). It is assumed that the carried-in substrate W has not undergone processing for asking of the resist. Also, the carried-in substrate W is often charged in the previous process (processing in a dry-etcher) and the amount of charge may be large.

Specifically, with all of the nozzles and the like being retracted from over the spin chuck 5, the controller 3 causes the hand of the transfer robot CR (see FIG. 1) with a substrate W held thereon to enter into the chamber 4, so that the substrate W, with the front surface (device forming surface) facing upward, is transferred to the spin chuck 5. The controller 3 then causes the spin motor 14 to start rotating the substrate W (step S2 in FIG. 6; substrate rotating step). The substrate W is accelerated to have a predefined liquid processing rate (within a range of 10 to 1500 rpm; e.g. 300 rpm) and kept at the liquid processing rate.

After the rotational speed of the substrate W reaches the liquid processing rate, the controller 3 executes a neutralizing liquid supplying step (liquid discharging step; step S4 in FIG. 6) of supplying carbonated water as neutralizing liquid onto the upper surface of the substrate W. In the neutralizing liquid supplying step (S4), the carbonated water discharged through the carbonated water nozzle 31 lands in the supply region DA on the upper surface of the substrate W. The supply region DA is set in the central portion on the upper surface of the substrate W. In the first substrate processing example, prior to the neutralizing liquid supplying step (S4), the controller 3 starts supplying humidified gas toward the central portion on the upper surface of the substrate W (i.e. a region including the supply region DA). That is, the controller 3 starts the humidified gas supplying step (step S3 in FIG. 6) before the start of the neutralizing liquid supplying step (S4).

Specifically, when the rotational speed of the substrate W reaches the liquid processing rate, the controller 3 controls the first nozzle moving unit 23 to move the chemical liquid nozzle 21 and the humidified gas nozzle 36 from their respective home positions to the central position. This causes the chemical liquid nozzle 21 and the humidified gas nozzle 36 to be disposed over the central portion of the substrate W.

After the chemical liquid nozzle 21 and the humidified gas nozzle 36 are disposed over the substrate W, the controller 3 opens the humidified gas valve 39. This causes highly humidified gas from the humidified gas generating unit 37 to be supplied to the humidified gas nozzle 36 and, as shown in FIG. 7, discharged through the discharge port of the humidified gas nozzle 36. The discharge flow rate of humidified gas through the humidified gas nozzle 36 is, for example, within a range of 5 to 100 liter/minute (e.g. 50 liter/minute).

The humidified gas discharged through the discharge port of the humidified gas nozzle 36 is blown onto the central portion on the upper surface of the substrate W (i.e. the region including the supply region DA) (humidified gas supplying step). This causes the humidified gas blown onto the upper surface of the substrate W to cover the supply region DA. If the substrate W carried into the chamber 4 is charged, supplying highly humidified gas onto the upper surface of the substrate W causes electrical charges carried on the upper surface of the substrate W to be diffused. Specifically, a water thin film is formed on the main surface of the substrate W and, via the thin film, electrical charges carried on the substrate W are easily diffused.

After elapse of a predetermined period of time since the start of humidified gas discharge through the humidified gas nozzle 36, the controller 3 opens the carbonated water valve 33 while continuing to discharge humidified gas. As shown in FIG. 8, this causes carbonated water to be discharged as neutralizing liquid through the carbonated water nozzle 31 toward the central portion on the upper surface of the substrate W. The carbonated water discharged through the carbonated water nozzle 31 lands on the supply region DA in the central portion on the upper surface of the substrate W. The carbonated water landing in the central portion on the upper surface of the substrate W receives a centrifugal force caused by the rotation of the substrate W to flow toward a peripheral edge portion of the substrate W on the upper surface of the substrate W. After elapse of a predefined period of time since the start of carbonated water discharge, the controller 3 closes the carbonated water valve 33 to stop discharging carbonated water through the carbonated water nozzle 31. The controller 3 also closes the humidified gas valve 39 to stop discharging humidified gas through the humidified gas nozzle 36.

Next, it is executed an SPM supplying step (processing liquid supplying step; step S5 in FIG. 6). Specifically, the controller 3 opens the sulfuric acid valve 26 and the hydrogen peroxide valve 29 simultaneously. This causes $H_2SO_4$ flowing through the inside of the sulfuric acid line 24 to be supplied to the chemical liquid nozzle 21 and hydrogen peroxide flowing through the hydrogen peroxide line 25 to be also supplied to the chemical liquid nozzle 21. $H_2SO_4$ and $H_2O_2$ are then mixed within the casing of the chemical liquid nozzle 21, so that a high-temperature (e.g. about 157 degrees C.) SPM is generated. The SPM is discharged through the discharge port of the chemical liquid nozzle 21 to land on the supply region DB in the central portion on the upper surface of the substrate W. The SPM through the chemical liquid nozzle 21 receives a centrifugal force caused by the rotation of the substrate W to flow outward along the upper surface of the substrate W, whereby an SPM liquid film covering the entire upper surface of the substrate W is formed on the substrate W. The resist on the substrate W is removed from the substrate W by SPM contained in the liquid film.

In the SPM supplying step (S5), the controller 3 may also control the first nozzle moving unit 23 to move the chemical liquid nozzle 21 between a peripheral edge position facing the upper surface of the substrate and the central position. In this case, the supply region DB can be scanned over the entire upper surface of the substrate W.

After elapse of a predefined period of processing time since the start of SPM discharge, the controller 3 closes the sulfuric acid valve 26 and the hydrogen peroxide valve 29 to stop discharging SPM through the chemical liquid nozzle 21. The controller 3 also moves the chemical liquid nozzle 21 and the humidified gas nozzle 36 from the central position to their respective home positions. This causes the chemical liquid nozzle 21 and the humidified gas nozzle 36 to be retracted from over the substrate W.

Next, it is executed a rinsing step (processing liquid supplying step; step S6 in FIG. 6) of supplying carbonated water as rinse liquid onto the substrate W. Specifically, the controller 3 opens the carbonated water valve 33 to cause carbonated water to be discharged through the carbonated water nozzle 31 toward the central portion on the upper surface of the substrate W. The carbonated water discharged through the carbonated water nozzle 31 lands in the central portion on the upper surface of the substrate W covered with SPM. The carbonated water landing in the central portion on the upper surface of the substrate W receives a centrifugal force caused by the rotation of the substrate W to flow toward a peripheral edge portion of the substrate W on the upper surface of the substrate W. This causes the SPM on the substrate W to be washed away outward by the carbonated water and discharged around the substrate W. This causes the chemical liquid and the resist residues to be rinsed off across the entire upper surface of the substrate W. After elapse of a predefined period of time since the start of the rinsing step (S6), the controller 3 closes the carbonated water valve 33 to stop discharging carbonated water through the carbonated water nozzle 31.

Next, it is executed a spin-drying step (step S7 in FIG. 6) of drying the substrate W.

Prior to starting the spin-drying step (S7), the controller 3 controls the second nozzle moving unit 50 to move the upper nozzle 10 from the home position lateral to the spin chuck 5 to the processing position (over the central portion on the upper surface of the substrate W) and, at the processing position, lowers the upper nozzle 10 to a proximal position for approximation to the substrate W, as shown in FIG. 9. In the state where the upper nozzle 10 is at the lowered position, the spacing between the lower surface of the upper nozzle 10 and the upper surface of the substrate W is, for example, about 3 to 5 mm. In the state where the upper nozzle 10 is disposed at the processing position (including the aforementioned proximal position), the central axis of the upper nozzle 10 is aligned with the rotational axis A1, as shown in FIG. 4.

Specifically, in the spin-drying step (S7), the controller 3 controls the spin motor 4 to accelerate the substrate W to reach a drying rotational speed (e.g. several thousands of rpms) that is higher than the rotational speed from the neutralizing liquid supplying step (S4) to the rinse liquid supplying step (S6) and rotate the substrate W at the drying rotational speed. This causes a great centrifugal force to be applied to liquid on the substrate W, whereby the liquid adhering to the substrate W is spun off around the substrate W. The liquid is thus removed from the substrate W and thereby the substrate W is dried.

In the spin-drying step (S7), the controller 3 also opens the gas valve 52 to start discharging dehumidified gas through the three gas discharge ports (the upper gas discharge port 55 (see FIG. 4), the lower gas discharge port 56 (see FIG. 4), and the central gas discharge port 57 (see FIG. 4)) of the upper nozzle. At this time, the discharge flow rate of dehumidified gas through the upper gas discharge port 55, the lower gas discharge port 56, and the central gas discharge port 57 is, for example, about 50 liter/minute, about 50 liter/minute, and about 50 liter/minute. This causes vertically overlapping three-layer annular gas flows to be formed over the substrate W and allows the entire upper surface of the substrate W to be covered with the three-layer annular gas flows, as shown in FIG. 9.

In the spin-drying step (S7), dehumidified gas with low humidity is supplied onto the upper surface of the substrate W. Accordingly, humidified gas, even if remaining around the main surface of the substrate W at the start of the spin-drying step (S7), can be replaced with dehumidified gas. It is therefore possible to execute the spin-drying step (S7) while maintaining a low-humidity atmosphere around the upper surface of the substrate W. This allows the upper surface of the substrate W to be satisfactorily dried in the spin-drying step (S7).

After elapse of a predetermined period of time since the start of high-speed rotation of the substrate W, the controller 3 then controls the spin motor 14 to stop the spin chuck 5 rotating the substrate W (step S8 in FIG. 6).

Next, the substrate W is carried out from inside the chamber 4 (step S9 in FIG. 6). Specifically, the controller 3 causes the hand of the transfer robot CR to enter into the chamber 4. The controller 3 then causes the hand of the transfer robot CR to hold the substrate W on the spin chuck 5. Thereafter, the controller 3 causes the hand of the transfer robot CR to be retracted from inside the chamber 4. This causes the substrate W with the resist having been removed from the front surface (device forming surface) to be carried out of the chamber 4.

As described heretofore, in accordance with the first preferred embodiment, the neutralizing liquid supplying step (S4) is executed before the SPM supplying step (S5). Also, highly humidified gas is supplied toward the central portion on the upper surface of the substrate W before the start of the neutralizing liquid supplying step (S4). If the substrate W carried into the chamber 4 is charged, supplying highly humidified gas into the central portion on the upper surface of the substrate W causes electrical charges carried in the central portion on the upper surface of the substrate W to be diffused. The supply of humidified gas is started prior to the start of the neutralizing liquid supplying step (S4) and continued until the end of the neutralizing liquid supplying step (S4). Accordingly, at the start of the neutralizing liquid supplying step (S4), when carbonated water discharged through the carbonated water nozzle 31 lands on the supply region DA, the electrical charges have been sufficiently removed from the supply region DA. That is, the carbonated water lands on the supply region DA from which the electrical charges have been sufficiently removed. This allows generation of electrostatic discharge due to discharge of carbonated water onto the substrate W to be suppressed or prevented.

Also, in the first preferred embodiment, the neutralizing liquid supplying step (S4) is executed before the SPM supplying step (S5). Since the carbonated water is more electrically conductive than the processing liquid, supplying the carbonated water onto the main surface of the substrate W allows generation of electrostatic discharge due to discharge of liquid (carbonated water) onto the substrate W to be suppressed or prevented more effectively.

It is therefore possible to suppress or prevent the occurrence of damage (in the pattern and/or device formed) on the upper surface of the substrate W.

In the processing unit 2 according to the first preferred embodiment, a second substrate processing example can also be practiced that is different from the first substrate processing example.

Figure 10:
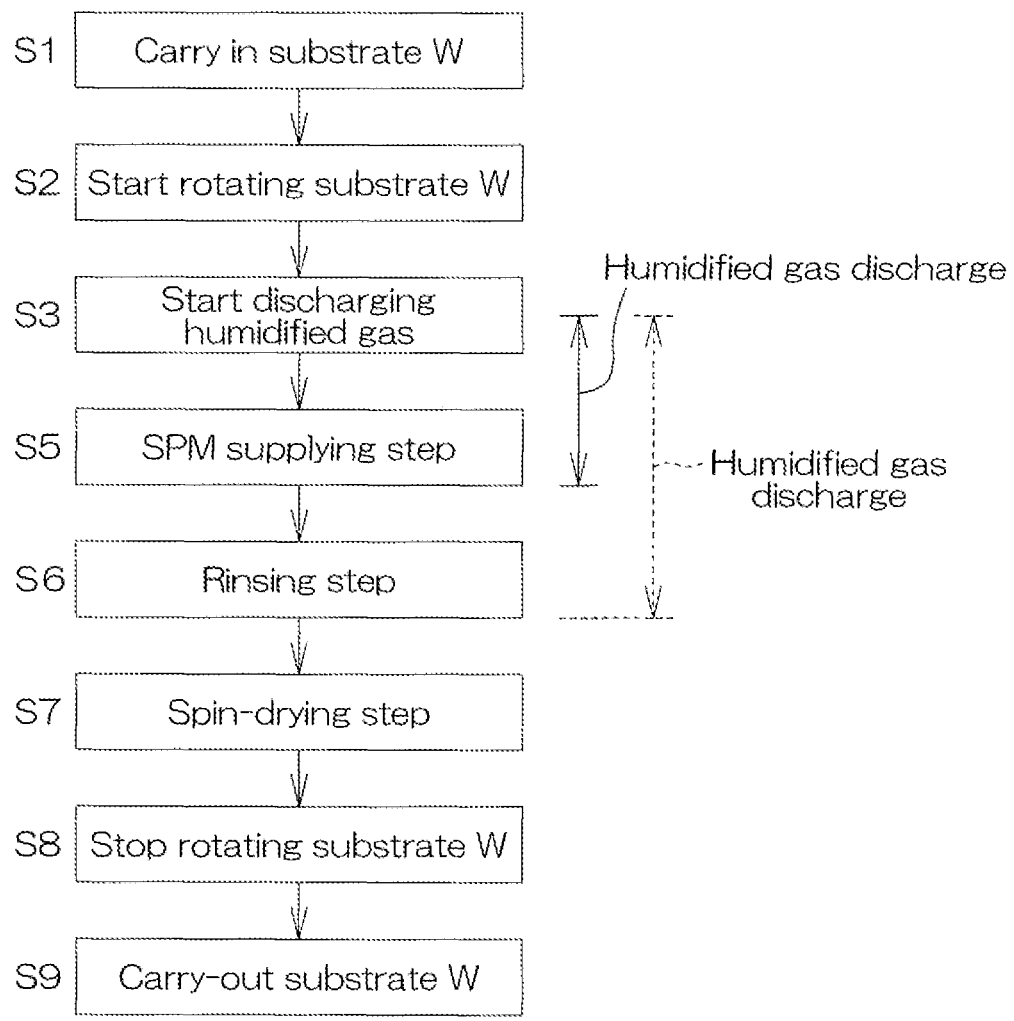
FIG. 10 is a flow chart for describing a second substrate processing example by the processing unit 2.

FIG. 10 is a flow chart for describing a second substrate processing example by the processing unit 2.

The second substrate processing example differs from the first substrate processing example in that the neutralizing liquid supplying step (S4 in FIG. 6) is omitted. In this case, the SPM supplying step (S5) is executed as the first liquid processing step on the substrate W carried into the chamber 4. SPM is supplied onto the substrate W carried into the chamber 4. That is, in the second substrate processing example, the SPM supplying step (S5) serves as a liquid discharging step.

In the second substrate processing example, highly humidified gas is supplied toward the central portion on the upper surface of the substrate W before the start of the SPM supplying step (S5). The supply of humidified gas is started prior to the start of the SPM supplying step (S5) and continued until the end of the SPM supplying step (S5). With the end of the SPM supplying step (S5), the supply of humidified gas is also stopped. Accordingly, at the start of the SPM supplying step (S5), when SPM discharged through the chemical liquid nozzle 21 lands on the supply region DB (see FIG. 7), the electrical charges have been sufficiently removed from the supply region DB. That is, the SPM lands on the supply region DB from which the electrical charges have been sufficiently removed. This allows generation of electrostatic discharge due to discharge of SPM onto the substrate W to be suppressed or prevented.

The timing to stop humidified gas supply into the central portion on the upper surface of the substrate W may be before the end of the liquid discharging step (S4 in FIG. 6, S5 in FIG. 10) as long as after the start of the liquid discharging step (S4 in FIG. 6, S5 in FIG. 10), though having been described in the first and second substrate processing examples that the timing is synchronized with the end of the liquid discharging step (the neutralizing liquid supplying step (S4 in FIG. 6) and the SPM supplying step (S5 in FIG. 10)).

The supply of humidified gas may be continued even after the end of the liquid discharging step (S4 in FIG. 6, S5 in FIG. 10). For example, as indicated by the dashed lines in FIGS. 6 and 10, the supply of humidified gas may be continued even after the end of the rinsing step (S6). In this case, the supply of humidified gas should be stopped before the start of the spin-drying step (S7) at the latest. This is for the reason that executing the supply of humidified gas during the spin-drying step (S7) will inhibit the upper surface of the substrate W from being satisfactorily dried in the spin-drying step (S7).

Figure 11:
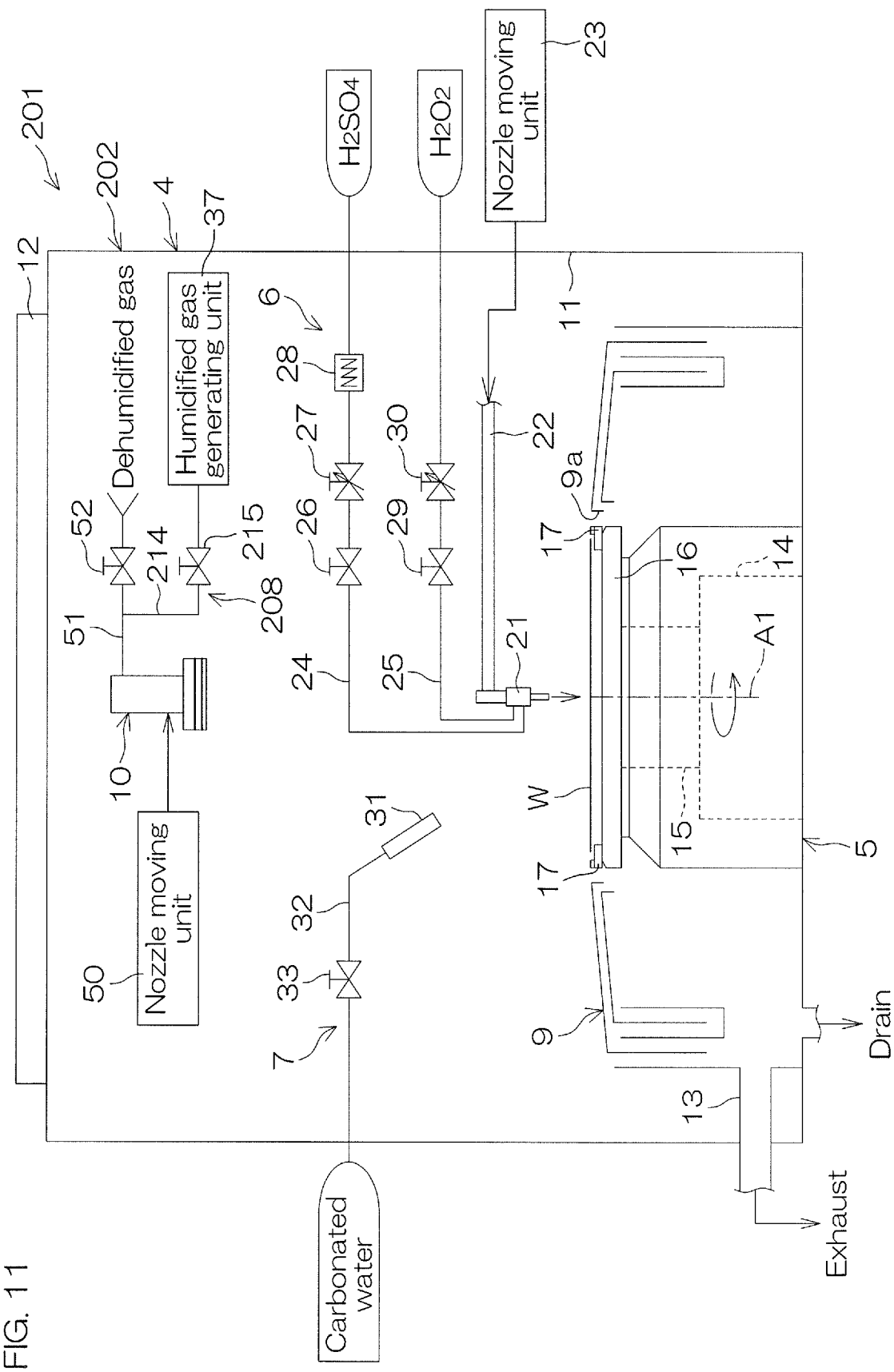
FIG. 11 is an illustrative cross-sectional view for describing an example configuration of a processing unit included in a second preferred embodiment of the present invention.

FIG. 11 is an illustrative cross-sectional view for describing an example configuration of a processing unit 202 included in a substrate processing apparatus 201 according to a second preferred embodiment of the present invention.

In the second preferred embodiment, components common to those in the aforementioned first preferred embodiment (shown in FIGS. 1 to 10) are designated by the same reference signs as in FIGS. 1 to 10 to omit the description thereof.

The processing unit 202 differs from the processing unit 2 mainly in that the humidified gas supplying unit 8 is omitted, while a humidified gas supplying unit 208 is provided instead. The humidified gas supplying unit 208 includes a humidified gas line 214 connected in a branched manner to the gas line 51 included in the upper nozzle 10 and a humidified gas valve 215 for opening and closing the humidified gas line 214. The humidified gas line 214 is supplied with humidified gas from the humidified gas generating unit 37. That is, dehumidified gas and humidified gas are to be supplied selectively to the gas introduction ports 58, 59 (see FIG. 4).

Opening the gas valve 52 while closing the humidified gas valve 215 causes dehumidified gas to be discharged radially through the gas discharge ports 55, 56 as well as discharged downward through the central gas discharge port 57 toward the upper surface of the substrate W. In contrast, opening the humidified gas valve 215 while closing the gas valve 52 causes humidified gas to be discharged radially through the gas discharge ports 55, 56 as well as discharged downward through the central gas discharge port 57 toward the upper surface of the substrate W. The humidified gas valve 215 is connected electrically to the controller 3 (see FIG. 5).

In the processing unit 202, the aforementioned first substrate processing example (see FIG. 6) or the second substrate processing example (see FIG. 10) is practiced.

In the humidified gas supplying step (step S3 in FIGS. 6 and 10), the controller 3 arranges the upper nozzle 10 at the processing position, which is at a position slightly higher than the lowered position (indicated by the solid line in FIG. 9), and causes humidified gas to be discharged through the gas discharge ports 55, 56, 57. In this case, the humidified gas discharged through the gas discharge ports 55, 56 forms two-layer radial gas flows and are also merged with the humidified gas discharged through the gas discharge port 57 to flow in the vicinity of (over) the upper surface of the substrate W along the upper surface of the substrate W.

In the spin-drying step (step S7 in FIGS. 6 and 10), the controller 3 arranges the upper nozzle 10 at the lowered position (indicated by the solid line in FIG. 9), and causes dehumidified gas to be discharged through the gas discharge ports 55, 56, 57. This is the same as the first and second substrate processing examples practiced in the processing unit 2 according to the first preferred embodiment (see FIG. 2).

Figure 12A:
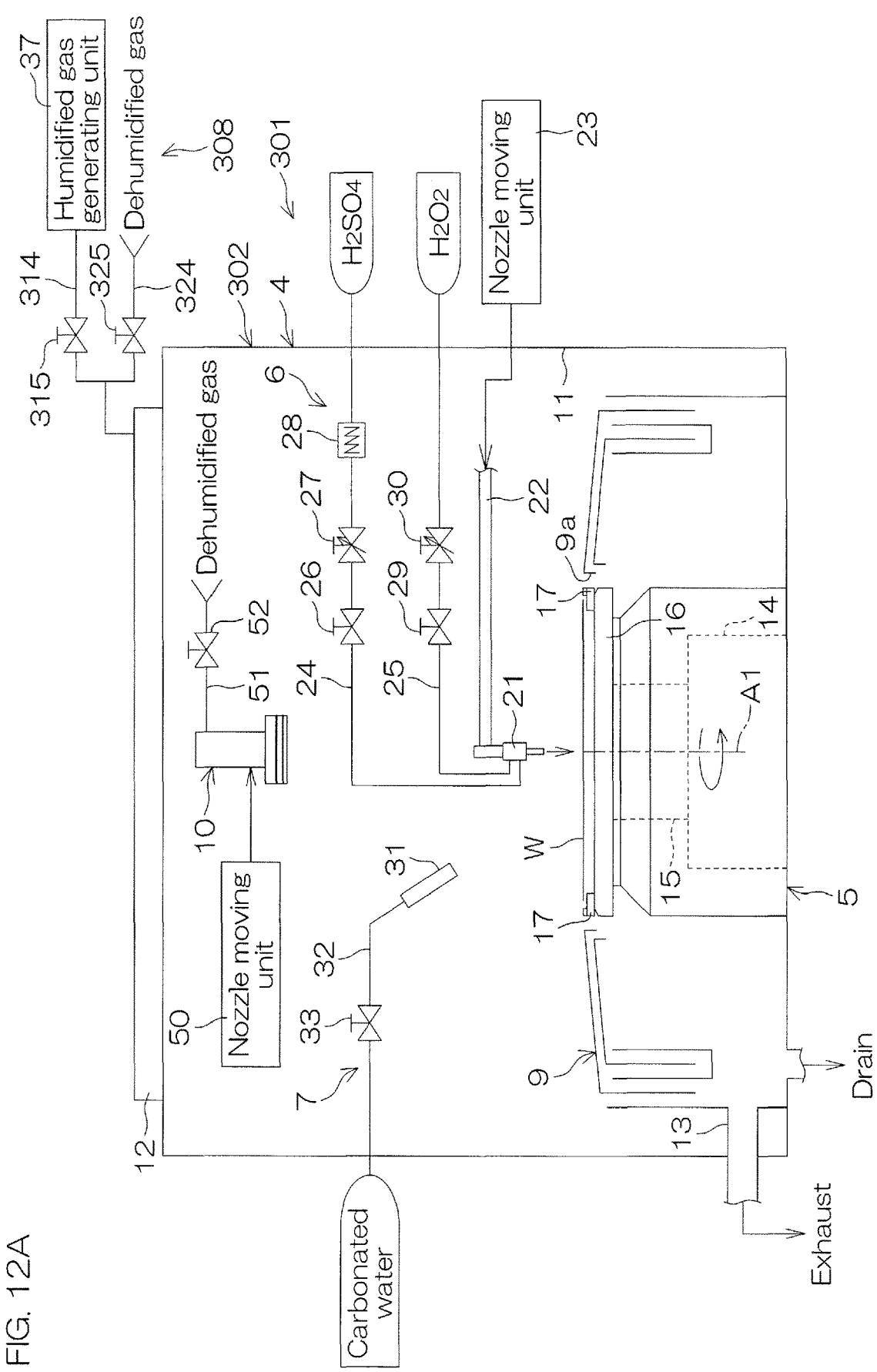
FIG. 12A is an illustrative cross-sectional view for describing an example configuration of a processing unit included in a third preferred embodiment of the present invention.

FIG. 12A is an illustrative cross-sectional view for describing an example configuration of a processing unit 302 included in a substrate processing apparatus 301 according to a third preferred embodiment of the present invention.

In the third preferred embodiment, components common to those in the aforementioned first preferred embodiment (shown in FIGS. 1 to 10) are designated by the same reference signs as in FIGS. 1 to 10 to omit the description thereof.

The processing unit 302 differs from the processing unit 2 mainly in that the humidified gas supplying unit 8 is omitted, while a humidified gas supplying unit 308 is provided instead. The humidified gas supplying unit 308 includes a humidified gas line 314 connected to the FFU 12 and a humidified gas valve 315 for opening and closing the humidified gas line 314. The FFU 12 also includes a dehumidified gas line 324 through which dehumidified gas (e.g. clean air) flows and a dehumidified gas valve 325 for opening and closing the dehumidified gas line 324.

Opening the dehumidified gas valve 325 while closing the humidified gas valve 315 causes dehumidified gas to be supplied from the FFU 12 into the chamber 4. In contrast, opening the humidified gas valve 315 while closing the dehumidified gas valve 325 causes humidified gas to be supplied from the FFU 12 into the chamber 4. The humidified gas valve 315 and the dehumidified gas valve 325 are connected electrically to the controller 3 (see FIG. 5).

In the processing unit 302, the aforementioned first substrate processing example (see FIG. 6) or the second substrate processing example (see FIG. 10) is practiced.

In the humidified gas supplying step (step S3 in FIGS. 6 and 10), the controller 3 opens the humidified gas valve 315 while closing the dehumidified gas valve 325 to cause humidified gas to be supplied from the FFU 12 into the chamber 4. Accordingly, the atmosphere within the chamber 4 is replaced with humidified gas, whereby the humidified gas can be supplied into the central portion on the upper surface of the substrate W.

In the spin-drying step (step S7 in FIGS. 6 and 10), the controller 3 opens the dehumidified gas valve 325 while closing the humidified gas valve 315 to cause dehumidified gas to be supplied from the FFU 12 into the chamber 4. Accordingly, the atmosphere within the chamber 4 is replaced with dehumidified gas, whereby the dehumidified gas can be supplied into the central portion on the upper surface of the substrate W.

Figure 12B:
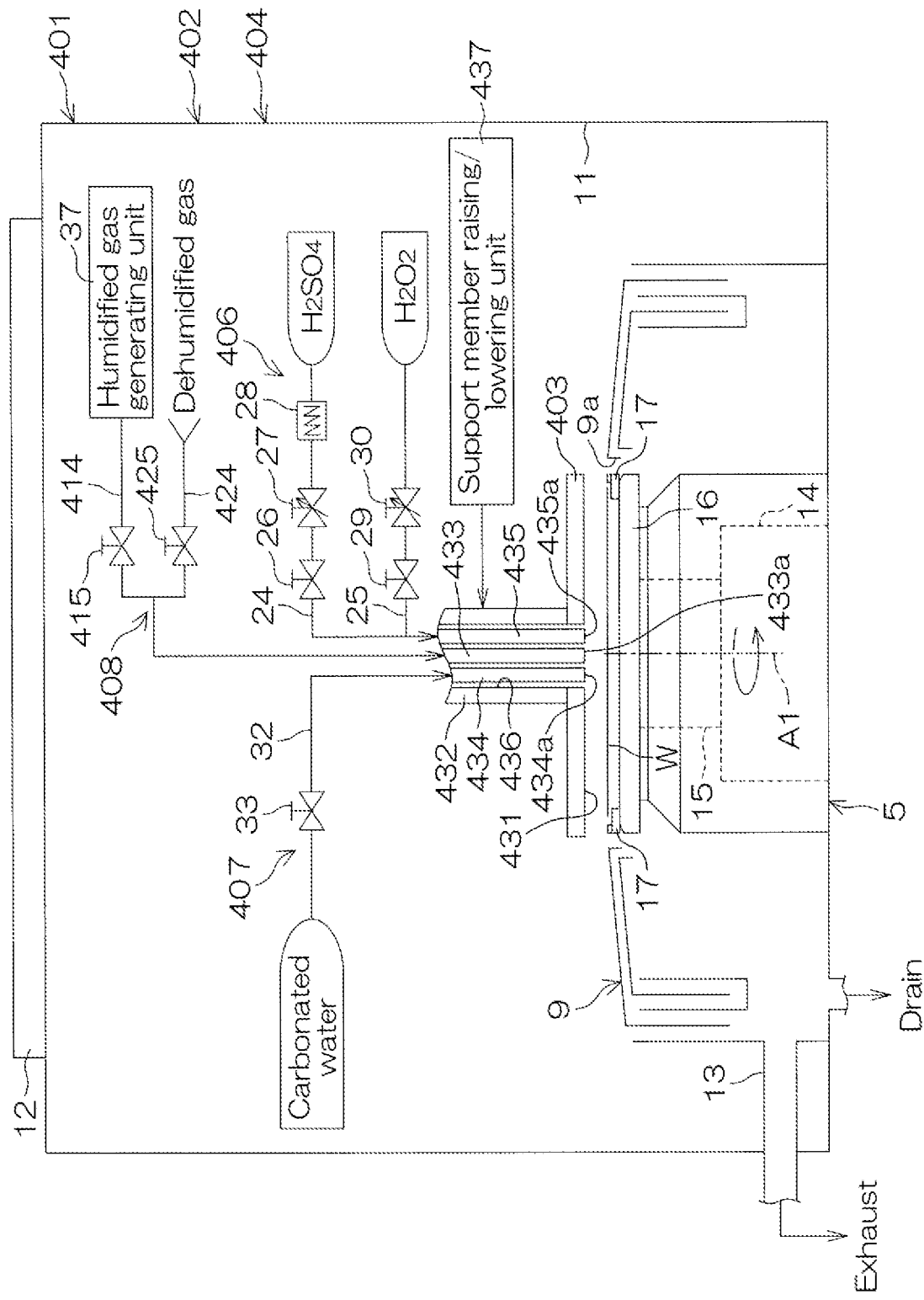
FIG. 12B is an illustrative cross-sectional view for describing an example configuration of a processing unit included in a fourth preferred embodiment of the present invention.

FIG. 12B is an illustrative cross-sectional view for describing an example configuration of a processing unit 402 included in a substrate processing apparatus 401 according to a fourth preferred embodiment of the present invention.

In the fourth preferred embodiment, components common to those in the aforementioned first preferred embodiment (shown in FIGS. 1 to 10) are designated by the same reference signs as in FIGS. 1 to 10 to omit the description thereof.

The processing unit 402 differs from the processing unit 2 mainly in that the upper nozzle 10 is omitted, while an opposing member 403 is provided instead. It further differs from the processing unit 2 in that a chemical liquid supplying unit (processing liquid supplying unit) 406, a carbonated water supplying unit (neutralizing liquid supplying unit) 407, and a humidified gas supplying unit 408 are provided, respectively, instead of the chemical liquid supplying unit 6, the carbonated water supplying unit 7, and the humidified gas supplying unit 8.

The opposing member 403 has a disk shape. The diameter of the opposing member 403 is equal to or greater than the diameter of the substrate W. The lower surface of the opposing member 403 forms a flat circular opposing surface 431 facing the upper surface of the substrate W held on the spin chuck 5. The opposing surface 431 is opposed to the entire upper surface of the substrate W. The opposing member 403 is supported on a holder 432 in a horizontal posture such that the central axis of the opposing member 403 is positioned on the rotational axis A1 of the spin chuck 5.

The holder 432, which is hollow and circular cylindrical and in which a vertical axis passing through the center of the opposing member 403 (a vertical axis aligned with the rotational axis A1 of the spin chuck 5) serves as a central axis, is fixed on the upper surface of the opposing member 403. The holder 432 is coupled with a support member raising/lowering unit 437. The controller 3 (see FIG. 5) is arranged to control the support member raising/lowering unit 437 to raise and lower the opposing surface 431 of the opposing member 403 between a proximal position (see FIG. 12B) for approximation to the upper surface of the substrate W held on the spin chuck 5 and a retracted position for substantial retraction upward from the spin chuck 5. The holder 432 is formed in a hollow shape, through which a gas nozzle 433, a carbonated water nozzle 434, and a chemical liquid nozzle 435 are inserted in a vertically extending manner.

A first discharge port 433a is formed at the leading end of the gas nozzle 433. The first discharge port 433a is opened in the opposing surface 431 via a through hole 436 formed in a central portion of the opposing member 403.

A second discharge port 434a is formed at the leading end of the carbonated water nozzle 434. The second discharge port 434a is opened in the opposing surface 431 via the through hole 436.

A third discharge port 435a is formed at the leading end of the chemical liquid nozzle 435. The third discharge port 435a is opened in the opposing surface 431 via the through hole 436.

The humidified gas supplying unit 408 includes the gas nozzle 433, a humidified gas line 414 connected to the upstream end of the gas nozzle 433, and a humidified gas valve 415 for opening and closing the humidified gas line 414. The humidified gas supplying unit 408 also includes a dehumidified gas line 424 connected to the upstream end of the gas nozzle 433 and a dehumidified gas valve 425 for opening and closing the dehumidified gas line 424.

Opening the dehumidified gas valve 425 while closing the humidified gas valve 415 causes dehumidified gas to be discharged through inside the casing (not shown) of the gas nozzle 433 from the first discharge port 433a. In contrast, opening the humidified gas valve 415 while closing the dehumidified gas valve 425 causes humidified gas to be discharged through inside the casing (not shown) of the gas nozzle 433 from the first discharge port 433a. The humidified gas valve 415 and the dehumidified gas valve 425 are connected electrically to the controller 3 (see FIG. 5).

The carbonated water supplying unit 407 includes the carbonated water nozzle 434, a carbonated water line 32 connected to the upstream end of the carbonated water nozzle 434, and a carbonated water valve 33. Opening the carbonated water valve 33 causes carbonated water to be discharged through inside the casing (not shown) of the carbonated water nozzle 434 from the second discharge port 434a.

The chemical liquid supplying unit 406 includes the chemical liquid nozzle 435, a sulfuric acid line 24 connected to the upstream end of the chemical liquid nozzle 435, a hydrogen peroxide line 25 connected to the upstream end of the chemical liquid nozzle 435, a sulfuric acid valve 26, and a hydrogen peroxide valve 29. When the sulfuric acid valve 26 and the hydrogen peroxide valve 29 are opened, $H_2SO_4$ from the sulfuric acid line 24 and $H_2O_2$ from the hydrogen peroxide line 25 are supplied into the casing (not shown) of the chemical liquid nozzle 435 and mixed (stirred) sufficiently within the casing (not shown). Thus mixing causes $H_2SO_4$ and $H_2O_2$ to be mixed homogeneously and react with each other, so that a mixture of $H_2SO_4$ and $H_2O_2$ (SPM) is generated. SPM contains peroxymonosulfuric acid ($H_2SO_5$), which is highly oxidative, and arranged to have an increased temperature higher than the temperature of $H_2SO_4$ and $H_2O_2$ before mixing (equal to or higher than 150 degrees C.; e.g. about 157 degrees C.). The generated high-temperature SPM is discharged through the third discharge port 435a that is opened at the leading end of the chemical liquid nozzle 435.

In the processing unit 402, the aforementioned first substrate processing example (see FIG. 6) or the second substrate processing example (see FIG. 10) is practiced.

In the humidified gas supplying step (step S3 in FIGS. 6 and 10), the controller 3 arranges the opposing member 403 at the proximal position and opens the humidified gas valve 415 while closing the dehumidified gas valve 425 to cause humidified gas to be discharged through the first discharge port 433a. The humidified gas discharged through the first discharge port 433a is blown onto the central portion on the upper surface of the substrate W (i.e. the region including a supply region to be described below). This causes the humidified gas blown onto the upper surface of the substrate W to cover the supply region DA. In this case, the humidified gas discharged through the first discharge port 433a is supplied between the opposing surface 431 and the upper surface of the substrate W, and the space between the opposing surface 431 and the upper surface of the substrate W is filled with the humidified gas.

In the neutralizing liquid supplying step (step S4 in FIG. 6), the controller 3 arranges the opposing member 403 at the proximal position and opens the carbonated water valve 33 to cause carbonated water to be discharged through the second discharge port 434a. The carbonated water discharged through the second discharge port 434a lands in a supply region (not shown) on the upper surface of the substrate W. The supply region is set in the central portion on the upper surface of the substrate W.

In the SPM supplying step (step S5 in FIGS. 6 and 10), the controller 3 arranges the opposing member 403 at the proximal position and opens the sulfuric acid valve 26 and the hydrogen peroxide valve 29 simultaneously. This causes SPM to be discharged through the third discharge port 435a and land in a supply region (not shown) in the central portion on the upper surface of the substrate W. The SPM landing in the supply region receives a centrifugal force caused by the rotation of the substrate W to flow outward along the upper surface of the substrate W, whereby an SPM liquid film covering the entire upper surface of the substrate W is formed on the substrate W. The resist on the substrate W is removed from the substrate W by SPM contained in the liquid film.

In the spin-drying step (step S7 in FIGS. 6 and 10), the controller 3 arranges the opposing member 403 at the proximal position and opens the dehumidified gas valve 425 while closing the humidified gas valve 415 to cause dehumidified gas to be discharged through the first discharge port 433a. This allows dehumidified gas to be supplied into the central portion on the upper surface of the substrate W.

While the four preferred embodiments of the present invention have heretofore been described, the present invention may be practiced in other modes.

Figure 13:
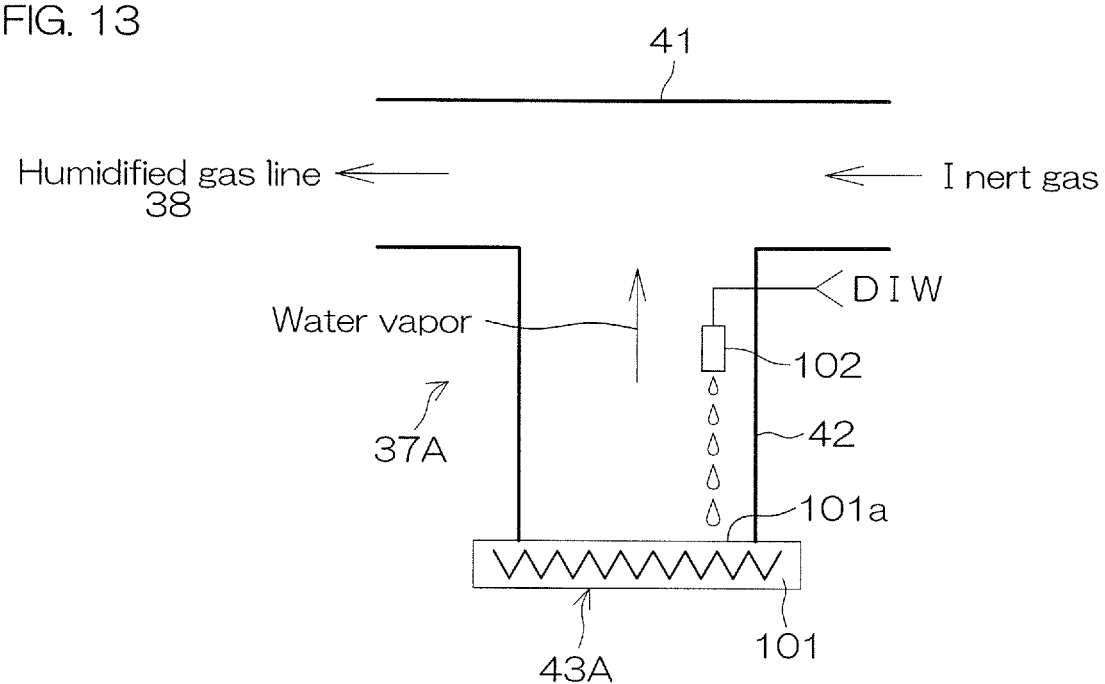
FIG. 13 is a view showing a first variation of the humidified gas generating unit.

For example, a humidified gas generating unit 37A shown in FIG. 13 may be employed instead of the humidified gas generating unit 37 (see FIG. 3). The humidified gas generating unit 37A includes a vapor generating unit 43A instead of the vapor generating unit 43. The vapor generating unit 43A includes a hot plate 101 and a dripping nozzle 102 for dripping water (e.g. DIW) onto the upper surface 101a of the hot plate 101. When the hot plate 101 is in an ON state, the upper surface 101a of the hot plate 101 is kept at a high temperature of 100 degrees C. or higher. When the hot plate 101 is in an ON state, dripping water through the dripping nozzle 102 over the hot plate 101 causes a drop of water through the dripping nozzle 102 to come into contact with the upper surface 101a of the hot plate 101 and then vaporized on the upper surface 101a. Thus, water vapor is generated in the vapor generating unit 43A.

Figure 14:
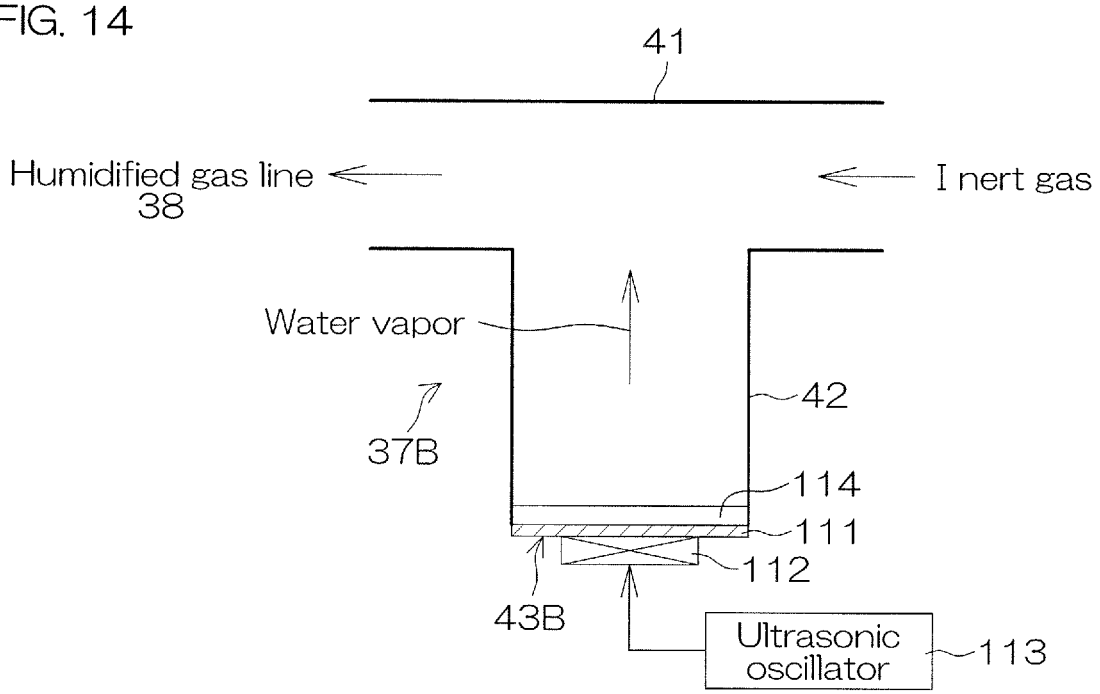
FIG. 14 is a view showing a second variation of the humidified gas generating unit.

Also, a humidified gas generating unit 37B shown in FIG. 14 may be employed instead of the humidified gas generating unit 37 (see FIG. 3). The humidified gas generating unit 37B includes a vapor generating unit 43B instead of the vapor generating unit 43. The vapor generating unit 43B includes a plate-shaped vibrating body 111 disposed in a horizontal posture and an ultrasonic vibrator 112 arranged to ultrasonically vibrate the vibrating body 111. The ultrasonic vibrator 112 is arranged to receive an electrical signal from an ultrasonic oscillator 113 controlled by the controller 3 to be ultrasonically vibrated. With a water (DIW) liquid film 114 being formed on the upper surface of the vibrating body 111, when the ultrasonic vibrator 112 is ultrasonically vibrated, the water contained in the liquid film 114 is applied with ultrasonic vibration and thereby vaporized. Thus, water vapor is generated in the vapor generating unit 43B.

Also, in the fourth preferred embodiment, the opposing member 403 may be a driven type opposing member (shut-off member) which rotates according to the rotation of the spin chuck 5 (spin base 16). That is, the opposing member 403 is supported on the spin chuck 5 in an integrally rotatable manner therewith during the substrate processing.

Also, in the aforementioned first to fourth preferred embodiments, the chemical liquid nozzle 21 and the humidified gas nozzle 36 may be supported on their respective different nozzle arms.

While the aforementioned preferred embodiments have been described by exemplifying the case of using SPM as chemical liquid, the chemical liquid is not limited to SPM. The chemical liquid may be a liquid containing at least one of, for example, sulfuric acid, acetic acid, nitric acid, hydrochloric acid, hydrofluoric acid, aqueous ammonia, hydrogen peroxide, organic acid (e.g. citric acid, oxalic acid), organic alkali (e.g. TMAH (tetramethylammonium hydroxide)), hydrophobizing agent (e.g. TMS, HMD), organic solvent (e.g. IPA (isopropyl alcohol)), surfactant, and corrosion inhibitor.

Further, the rinse liquid may employ water other than carbonated water. Such water may be, for example, DIW (deionized water), electrolytic ionized water, hydrogen water, ozone water, hydrochloric acid water of dilute concentration (e.g. about 10 to 100 ppm), regenerated water (hydrogen water), and degassed water.

Furthermore, while the aforementioned preferred embodiments have been described by exemplifying the case where the substrate processing apparatuses 1, 201, 301 are apparatuses arranged to process disk-shaped substrates W, the substrate processing apparatuses 1, 201, 301 may be apparatuses arranged to process polygonal substrates W such as substrates for liquid crystal displays.

While the preferred embodiments of the present invention have heretofore been described in detail, these are merely specific examples used to clarify the technical contents of the present invention, and the present invention should not be interpreted as being limited only to these specific examples. The scope of the present invention shall be limited only by the appended claims.

This application corresponds to Japanese Patent Application No. 2017-090264 filed on Apr. 28, 2017 with the Japan Patent Office, the disclosure of which is incorporated herein by reference in its entirety.

REFERENCE SIGNS LIST

1: Substrate processing apparatus
3: Controller
4: Chamber
5: Spin chuck (substrate holding unit)
6: Chemical liquid supplying unit (processing liquid supplying unit)
7: Carbonated water supplying unit (neutralizing liquid supplying unit)
8: Humidified gas supplying unit
10: Upper nozzle (first nozzle, second nozzle)
14: Spin motor (rotating unit)
36: Humidified gas nozzle (first nozzle)
201: Substrate processing apparatus
208: Humidified gas supplying unit
301: Substrate processing apparatus
308: Humidified gas supplying unit
401: Substrate processing apparatus
403: Opposing member
406: Chemical liquid supplying unit (processing liquid supplying unit)
407: Carbonated water supplying unit (neutralizing liquid supplying unit)
408: Humidified gas supplying unit
431: Opposing surface
A1: Rotational axis
DA: Supply region
DB: Supply region
W: Substrate

What is claimed is:

1. A substrate processing method of processing a substrate with processing liquid, the method comprising:
    a processing liquid discharging step of discharging processing liquid through a nozzle toward a predetermined supply region on a main surface of a substrate held on a substrate holder within a chamber, the processing liquid discharging step including a step of supplying a chemical liquid onto the main surface of the substrate and a step of supplying a rinse liquid onto the main surface of the substrate;
    a neutralizing liquid supplying step of discharging a neutralizing liquid through a nozzle toward a central portion of the main surface of the substrate to supply the neutralizing liquid thereto, prior to the processing liquid discharging step;
    a humidified gas supplying step of supplying humidified gas having a humidity higher than a humidity within the chamber onto the central portion of the main surface of the substrate to remove electrical charges carried on the substrate; and
    a spin-drying step of rotating the substrate about a predetermined rotational axis after the processing liquid discharging step to spin off liquid component from the main surface of the substrate, wherein
    the humidified gas supplying step is started before a start of the neutralizing liquid supplying step and is ended at a predetermined termination timing after the start of the neutralizing liquid supplying step and before the spin-drying step,
    the humidified gas supplying step comprises a step of blowing the humidified gas through a humidified gas nozzle accommodated within the chamber toward the central portion of the main surface of the substrate while rotating the substrate around the predetermined rotational axis,
    the chamber includes a ceiling that defines a space in which the substrate holder and the humidified gas nozzle are accommodated, and
    the humidified gas nozzle discharges the humidified gas at a position closer to the main surface of the substrate held on the substrate holder than to the ceiling.

2. The substrate processing method according to claim 1, wherein
    the termination timing is a predetermined timing before an end of the processing liquid discharging step or at the end of the processing liquid discharging step.

3. The substrate processing method according to claim 1, further comprising, in parallel with the spin-drying step, a dehumidified gas supplying step of supplying dehumidified gas having a humidity lower than the humidity of the humidified gas onto the main surface of the substrate.

4. The substrate processing method according to claim 1, wherein the neutralizing liquid is carbonated water.

5. The substrate processing method according to claim 1, wherein the humidified gas supply step supplies humidified gas prepared by adding water vapor to inert gas.

6. The substrate processing method according to claim 1, wherein the humidified gas supplying step suppresses an electrostatic discharge that otherwise occurs when the neutralizing liquid lands on the main surface of the substrate.

7. A substrate processing method of processing a substrate with processing liquid, the method comprising:
    a processing liquid discharging step of discharging processing liquid through a nozzle toward a predetermined supply region on a main surface of a substrate held on a substrate holder within a chamber, the processing liquid discharging step including a step of supplying a chemical liquid onto the main surface of the substrate and a step of supplying a rinse liquid onto the main surface of the substrate;
    a neutralizing liquid supplying step of discharging a neutralizing liquid through a nozzle toward a central portion of the main surface of the substrate to supply the neutralizing liquid thereto, prior to the processing liquid discharging step;
    a humidified gas supplying step of supplying humidified gas having a humidity higher than a humidity within the chamber onto the central portion of the main surface of the substrate to remove electrical charges carried on the substrate; and
    a spin-drying step of rotating the substrate about a predetermined rotational axis after the processing liquid discharging step to spin off liquid component from the main surface of the substrate, wherein
    the humidified gas supplying step is started before a start of the neutralizing liquid supplying step and is ended at a predetermined termination timing after the start of the neutralizing liquid supplying step and before the spin-drying step,
    the humidified gas supplying step comprises a step of discharging the humidified gas through a humidified gas nozzle accommodated within the chamber toward the central portion of the main surface of the substrate and radially along the main surface of the substrate while rotating the substrate about the predetermined rotational axis, thereby forming, in a vicinity of the main surface of the substrate, a gas flow of the humidified gas flowing along the main surface of the substrate, the chamber includes a ceiling that defines a space in which the substrate holder and the humidified gas nozzle are accommodated, and the humidified gas nozzle discharges the humidified gas at a position closer to the main surface of the substrate held on the substrate holder than to the ceiling.

8. The substrate processing method according to claim 7, wherein the humidified gas supply step supplies humidified gas prepared by adding water vapor to inert gas.

9. The substrate processing method according to claim 7, wherein the humidified gas supplying step suppresses an electrostatic discharge that otherwise occurs when the neutralizing liquid lands on the main surface of the substrate.

10. A substrate processing method of processing a substrate with processing liquid, the method comprising:

a processing liquid discharging step of discharging processing liquid through a nozzle toward a predetermined supply region on a main surface of a substrate held on a substrate holder within a chamber, the processing liquid discharging step including a step of supplying a chemical liquid onto the main surface of the substrate and a step of supplying a rinse liquid onto the main surface of the substrate;

a neutralizing liquid supplying step of discharging a neutralizing liquid through a nozzle toward the central portion of the main surface of the substrate to supply the neutralizing liquid thereto, prior to the processing liquid discharging step;

a humidified gas supplying step of supplying humidified gas having a humidity higher than a humidity within the chamber onto the central portion of the main surface of the substrate to remove electrical charges carried on the substrate; and a spin-drying step of rotating the substrate about a predetermined rotational axis after the processing liquid discharging step to spin off liquid component from the main surface of the substrate, wherein the humidified gas supplying step is started before a start of the neutralizing liquid supplying step and is ended at a predetermined termination timing after the start of the neutralizing liquid supplying step and before the spin-drying step, the humidified gas supplying step comprises a step of blowing the humidified gas through a gas discharge port opened in an opposing surface, facing an entire area of the main surface of the substrate, of an opposing member accommodated within the chamber toward the central portion of the main surface of the substrate while rotating the substrate around the predetermined rotational axis, thereby supplying the humidified gas into a space between the opposing surface and the main surface of the substrate, the chamber includes a ceiling that defines a space in which the substrate holder and the opposing member are accommodated, the opposing surface is positioned closer to the main surface of the substrate than the ceiling, and the gas discharge port discharges the humidified gas at a position closer to the main surface of the substrate held on the substrate holder than to the ceiling.

11. The substrate processing method according to claim 10, wherein the humidified gas supply step supplies humidified gas prepared by adding water vapor to inert gas.

12. The substrate processing method according to claim 10, wherein the humidified gas supplying step suppresses an electrostatic discharge that otherwise occurs when the neutralizing liquid lands on the main surface of the substrate.

13. A substrate processing apparatus arranged to process a substrate with processing liquid, the apparatus comprising:

a chamber;

a substrate holder accommodated within the chamber to hold a substrate;

a substrate rotator that rotates the substrate held on the substrate holder about a predetermined rotational axis;

a processing liquid supply that supplies processing liquid toward a main surface of the substrate held on the substrate holder, the processing liquid supply including a chemical supply that supplies a chemical liquid onto the main surface of the substrate, and a rinse liquid supply that supplies a rinse liquid onto the main surface of the substrate;

a neutralizing liquid supply that supplies, through a nozzle, a conductive neutralizing liquid with a specific resistance lower than a specific resistance of the processing liquid onto the main surface of the substrate held on the substrate holder;

a humidified gas supply that supplies humidified gas having a humidity higher than a humidity within the chamber onto the main surface of the substrate held on the substrate holder; and a controller that controls the processing liquid supply, the neutralizing liquid supply, and the humidified gas supply, wherein the controller is arranged to execute a step of supplying the chemical liquid onto the main surface of the substrate by the chemical supply, a step of thereafter supplying the rinse liquid onto the main surface of the substrate by the rinse liquid supply so as to replace the chemical liquid, a neutralizing liquid supplying step of supplying, by the neutralizing liquid supply, the neutralizing liquid onto a central portion of the main surface of the substrate by discharging the neutralizing liquid through the nozzle toward the central portion of the main surface of the substrate, prior to the supply of the chemical liquid, a humidified gas supplying step of supplying, by the humidified gas supply, the humidified gas onto the central portion of the main surface of the substrate to remove electrical charges carried on the substrate, and a spin-drying step of rotating the substrate about the rotational axis after the step of supplying the rinse liquid to spin off liquid component from the main surface of the substrate, the controller is further arranged to start the humidified gas supplying step before a start of the neutralizing liquid supplying step and to end the humidified gas supplying step at a predetermined termination timing after the start of the neutralizing liquid supplying step and before the spin-drying step, the humidified gas supply has a humidified gas nozzle, accommodated within the chamber, that blows the humidified gas therethrough toward the central portion of the main surface of the substrate, the controller is arranged to execute, in the humidified gas supplying step, a step of blowing the humidified gas through the humidified gas nozzle toward the central portion of the main surface of the substrate while rotating the substrate about the predetermined rotational axis, the chamber includes a ceiling that defines a space in which the substrate holder and the humidified gas nozzle are accommodated, and the humidified gas nozzle discharges the humidified gas at a position closer to the main surface of the substrate held on the substrate holder than to the ceiling.

14. The substrate processing apparatus according to claim 13, wherein
the termination timing is a predetermined timing before an end of the step of supplying the rinse liquid or at the end of the step of supplying the rinse liquid.

15. The substrate processing apparatus according to claim 13, wherein
the controller is arranged to further execute, in parallel with the spin-drying step, a dehumidified gas supplying step of supplying dehumidified gas having a humidity lower than the humidity of the humidified gas onto the main surface of the substrate.

16. The substrate processing apparatus according to claim 13, wherein neutralizing liquid supply supplies carbonated water as the neutralizing liquid.

17. The substrate processing apparatus according to claim 13, wherein the humidified gas supply supplies humidified gas prepared by adding water vapor to inert gas.

18. A substrate processing apparatus arranged to process a substrate with processing liquid, the apparatus comprising:
a chamber;
a substrate holder accommodated within the chamber to hold a substrate;
a substrate rotator that rotates the substrate held on the substrate holder about a predetermined rotational axis;
a processing liquid supply that supplies processing liquid toward a main surface of the substrate held on the substrate holder, the processing liquid supply including a chemical supply that supplies a chemical liquid onto the main surface of the substrate, and a rinse liquid supply that supplies a rinse liquid onto the main surface of the substrate;
a neutralizing liquid supply that supplies, through a nozzle, a conductive neutralizing liquid with a specific resistance lower than a specific resistance of the processing liquid onto the main surface of the substrate held on the substrate holder;
a humidified gas supply that supplies humidified gas having a humidity higher than a humidity within the chamber onto the main surface of the substrate held on the substrate holder; and
a controller that controls the processing liquid supply, the neutralizing liquid supply, and the humidified gas supply, wherein
the controller is arranged to execute a step of supplying the chemical liquid onto the main surface of the substrate by the chemical supply, a step of thereafter supplying the rinse liquid onto the main surface of the substrate by the rinse liquid supply so as to replace the chemical liquid, a neutralizing liquid supplying step of supplying, by the neutralizing liquid supply, the neutralizing liquid onto a central portion of the main surface of the substrate by discharging the neutralizing liquid through the nozzle toward the central portion of the main surface of the substrate, prior to the supply of the chemical liquid, a humidified gas supplying step of supplying, by the humidified gas supply, the humidified gas onto the central portion of the main surface of the substrate to remove electrical charges carried on the substrate, and a spin-drying step of rotating the substrate about the rotational axis after the step of supplying the rinse liquid to spin off liquid component from the main surface of the substrate, the controller is further arranged to start the humidified gas supplying step before a start of the neutralizing liquid supplying step and to end the humidified gas supplying step at a predetermined termination timing after the start of the neutralizing liquid supplying step and before the spin-drying step,
the humidified gas supply includes a humidified gas nozzle accommodated within the chamber, the humidified gas nozzle having a first gas discharge port that discharges the humidified gas toward the central portion of the main surface of the substrate held on the substrate holder and a second gas discharge port, opened annularly outward, that discharges the humidified gas radially along the main surface of the substrate held on the substrate holder,
the controller is arranged to execute, in the humidified gas supplying step, a step of discharging the humidified gas through the humidified gas nozzle toward the central portion of the main surface of the substrate and radially along the main surface of the substrate while rotating the substrate about the predetermined rotational axis, thereby forming, in a vicinity of the main surface of the substrate, a gas flow of the humidified gas flowing along the main surface of the substrate,
the chamber includes a ceiling that defines a space in which the substrate holder and the humidified gas nozzle are accommodated, and
the humidified gas nozzle discharges the humidified gas at a position closer to the main surface of the substrate held on the substrate holder than to the ceiling.

19. The substrate processing apparatus according to claim 18, wherein the humidified gas supply supplies humidified gas prepared by adding water vapor to inert gas.

20. A substrate processing apparatus arranged to process a substrate with processing liquid, the apparatus comprising:
a chamber;
a substrate holder accommodated within the chamber to hold a substrate;
a substrate rotator that rotates the substrate held on the substrate holder about a predetermined rotational axis;
a processing liquid supply that supplies processing liquid toward a main surface of the substrate held on the substrate holder, the processing liquid supply including a chemical supply that supplies a chemical liquid onto the main surface of the substrate, and a rinse liquid supply that supplies a rinse liquid onto the main surface of the substrate;
a neutralizing liquid supply that supplies, through a nozzle, a conductive neutralizing liquid with a specific resistance lower than a specific resistance of the processing liquid onto the main surface of the substrate held on the substrate holder;
a humidified gas supply that supplies humidified gas having a humidity higher than a humidity within the chamber onto the main surface of the substrate held on the substrate holder; and
a controller that controls the processing liquid supply, the neutralizing liquid supply, and the humidified gas supply, wherein
the controller is arranged to execute a step of supplying the chemical liquid onto the main surface of the substrate by the chemical supply, a step of thereafter supplying the rinse liquid onto the main surface of the substrate by the rinse liquid supply so as to replace the chemical liquid, a neutralizing liquid supplying step of supplying, by the neutralizing liquid supply, the neutralizing liquid onto a central portion of the main surface of the substrate by discharging the neutralizing liquid through the nozzle toward the central portion of the main surface of the substrate, prior to the supply of the chemical liquid, a humidified gas supplying step of supplying, by the humidified gas supply, the humidified gas onto the central portion of the main surface of the substrate to remove electrical charges carried on the substrate, and a spin-drying step of rotating the substrate about the rotational axis after the step of supplying the rinse liquid to spin off liquid component from the main surface of the substrate, the controller is further arranged to start the humidified gas supplying step before a start of the neutralizing liquid supplying step and to end the humidified gas supplying step at a predetermined termination timing after the start of the neutralizing liquid supplying step and before the spin-drying step, the substrate processing apparatus further comprises an opposing member, accommodated within the chamber, having an opposing surface facing an entire area of the main surface of the substrate held on the substrate holder; and a discharge port, opened in the opposing surface, that discharges the humidified gas toward the central portion of the main surface of the substrate held on the substrate holder, the controller is arranged to execute, in the humidified gas supplying step, a step of blowing the humidified gas through the gas discharge port toward the central portion of the main surface of the substrate held on the substrate holder while rotating the substrate about the predetermined rotational axis, thereby supplying the humidified gas into a space between the opposing surface and the main surface of the substrate held on the substrate holder, the chamber includes a ceiling that defines a space in which the substrate holder and the opposing member are accommodated, the opposing surface is positioned closer to the main surface of the substrate than the ceiling, and the gas discharge port discharges the humidified gas at a position closer to the main surface of the substrate held on the substrate holder than to the ceiling.

21. The substrate processing apparatus according to claim 20, wherein the humidified gas supply supplies humidified gas prepared by adding water vapor to inert gas.

* * * * *